(12) United States Patent
Choi et al.

(10) Patent No.: US 10,374,003 B2
(45) Date of Patent: Aug. 6, 2019

(54) SEMICONDUCTOR LIGHT EMITTING DEVICE AND LED MODULE USING THE SAME

(71) Applicant: SAMSUNG ELECTRONICS CO., LTD., Suwon-si, Gyeonggi-do (KR)

(72) Inventors: Pun Jae Choi, Yongin-si (KR); Jacob Chang-Lin Tarn, Hwaseong-si (KR); Han Kyu Seong, Seoul (KR); Jin Hyuk Song, Incheon (KR); Yoon Joon Choi, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/850,232

(22) Filed: Dec. 21, 2017

(65) Prior Publication Data

US 2018/0350872 A1  Dec. 6, 2018

(30) Foreign Application Priority Data

May 30, 2017  (KR) .................. 10-2017-0066669

(51) Int. Cl.
*H01L 27/00* (2006.01)
*H01L 33/00* (2010.01)
(Continued)

(52) U.S. Cl.
CPC ............ *H01L 27/156* (2013.01); *F21K 9/232* (2016.08); *F21K 9/235* (2016.08); *F21K 9/237* (2016.08);
(Continued)

(58) Field of Classification Search
CPC ... H01L 25/0753; H01L 25/03; H01L 27/156; H01L 27/153; H01L 27/3281;
(Continued)

(56) References Cited

U.S. PATENT DOCUMENTS 4,626,878 A * 12/1986 Kuwano ............... H01L 31/167
257/448
6,372,608 B1  4/2002 Shimoda et al.
(Continued)

OTHER PUBLICATIONS

US 9,488,323 B2, 11/2016, Steele et al. (withdrawn)

*Primary Examiner* — Nikolay K Yushin
(74) *Attorney, Agent, or Firm* — Lee & Morse, P.C.

(57) ABSTRACT

A semiconductor light emitting device includes a plurality of light emitting cells having first and second surface opposing each other, the plurality of light emitting cells including a first conductivity-type semiconductor layer, a second conductivity-type semiconductor layer, and an active layer therebetween, an insulating layer on the second surface of the plurality of light emitting cells and having first and second openings defining a first contact region of the first conductivity-type semiconductor layer and a second contact region of the second conductivity-type semiconductor layer, respectively, a connection electrode on the insulating layer and connecting a first contact region and a second contact region of adjacent light emitting cells, a transparent support substrate on the first surface of the plurality of light emitting cells, and a transparent bonding layer between the plurality of light emitting cells and the transparent support substrate.

17 Claims, 17 Drawing Sheets

(51) Int. Cl.
| | |
|---|---|
| *H01L 27/15* | (2006.01) |
| *H01L 33/18* | (2010.01) |
| *H01L 33/22* | (2010.01) |
| *H01L 33/24* | (2010.01) |
| *H01L 33/32* | (2010.01) |
| *H01L 33/38* | (2010.01) |
| *H01L 33/44* | (2010.01) |
| *H01L 33/46* | (2010.01) |
| *H01L 33/50* | (2010.01) |
| *H01L 33/62* | (2010.01) |
| *H01L 25/075* | (2006.01) |
| *F21K 9/232* | (2016.01) |
| *F21K 9/235* | (2016.01) |
| *F21K 9/237* | (2016.01) |
| *H01L 33/06* | (2010.01) |
| *H01L 31/105* | (2006.01) |
| *H01L 31/0352* | (2006.01) |
| *H01L 31/00* | (2006.01) |
| *F21V 31/00* | (2006.01) |
| *F21Y 115/10* | (2016.01) |

(52) U.S. Cl.
CPC .......... *H01L 25/0753* (2013.01); *H01L 31/00* (2013.01); *H01L 31/0352* (2013.01); *H01L 31/035236* (2013.01); *H01L 31/105* (2013.01); *H01L 33/06* (2013.01); *H01L 33/18* (2013.01); *H01L 33/22* (2013.01); *H01L 33/24* (2013.01); *H01L 33/32* (2013.01); *H01L 33/387* (2013.01); *H01L 33/44* (2013.01); *H01L 33/46* (2013.01); *H01L 33/502* (2013.01); *H01L 33/505* (2013.01); *H01L 33/62* (2013.01); *F21V 31/005* (2013.01); *F21Y 2115/10* (2016.08)

(58) Field of Classification Search
CPC ......... H01L 33/06; H01L 33/18; H01L 33/22; H01L 33/24; H01L 33/32; H01L 33/387; H01L 33/44; H01L 33/46; H01L 33/502; H01L 33/505; H01L 33/62; H01L 31/035236; H01L 31/105; H01L 31/0352; H01L 31/035281; F21K 9/232; F21K 9/235; F21K 9/237; F21Y 2115/10; F21V 31/005

See application file for complete search history.

(56) References Cited

U.S. PATENT DOCUMENTS

| | | | |
|---|---|---|---|
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,964,883 B2 | 6/2011 | Mazzochette et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,110,421 B2* | 2/2012 | Sugizaki | H01L 33/44 257/98 |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,366,295 B2 | 2/2013 | Tanda et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,704,257 B2* | 4/2014 | Chen | H01L 33/46 257/98 |
| 8,735,931 B2 | 5/2014 | Han et al. | |
| 8,766,295 B2 | 7/2014 | Kim | |
| 8,805,131 B2* | 8/2014 | Shiraishi | G02B 6/4214 385/14 |
| 8,975,653 B2* | 3/2015 | Choi | H01L 33/08 257/98 |
| 9,065,022 B2 | 6/2015 | Pu et al. | |
| 9,240,529 B2 | 1/2016 | Demille et al. | |
| 9,257,612 B2* | 2/2016 | Hoppel | H01L 33/382 |
| 9,293,663 B1* | 3/2016 | Obata | H01L 33/486 |
| 9,497,823 B2 | 11/2016 | McRae et al. | |
| 9,546,762 B2* | 1/2017 | Chen | H01L 24/24 |
| 2010/0148198 A1* | 6/2010 | Sugizaki | H01L 33/44 257/98 |
| 2011/0121291 A1* | 5/2011 | Chen | H01L 33/46 257/43 |
| 2012/0002915 A1* | 1/2012 | Shiraishi | G02B 6/4214 385/14 |
| 2013/0140598 A1* | 6/2013 | Hoppel | H01L 33/40 257/98 |
| 2013/0320363 A1* | 12/2013 | Pan | H01L 25/0753 257/88 |
| 2014/0070263 A1* | 3/2014 | Choi | H01L 33/08 257/99 |
| 2014/0369036 A1 | 12/2014 | Feng | |
| 2015/0070871 A1* | 3/2015 | Chen | H01L 24/24 362/84 |
| 2015/0255440 A1 | 9/2015 | Hsieh | |
| 2015/0380612 A1* | 12/2015 | Yang | H01L 27/156 257/89 |
| 2016/0079483 A1* | 3/2016 | Obata | H01L 33/486 257/91 |
| 2016/0099393 A1 | 4/2016 | He et al. | |
| 2016/0348853 A1 | 12/2016 | Tanda et al. | |
| 2017/0141280 A1* | 5/2017 | Zhong | H01L 33/62 |

* cited by examiner

SEMICONDUCTOR LIGHT EMITTING DEVICE AND LED MODULE USING THE SAME

CROSS-REFERENCE TO RELATED APPLICATION

Korean Patent Application No. 10-2017-0066669, filed on May 30, 2017, in the Korean Intellectual Property Office, and entitled: "Semiconductor Light Emitting Device and Led Module Using the Same," is incorporated by reference herein in its entirety.

BACKGROUND

1. Field

The present disclosure relates to a semiconductor light emitting device and a light emitting diode (LED) module using the same.

2. Description of the Related Art

In general, incandescent lamps and fluorescent lamps are widely used as indoor and outdoor lighting sources. Such incandescent lamps and fluorescent lamps may have a relatively short lifespan, so that problems in which light sources thereof frequently have to be replaced may occur.

In order to solve such a problem, lighting devices employing LEDs having excellent controllability, fast response speeds, high electro-optical conversion efficiency, long lifespans, low power consumption, and high luminance characteristics have been developed. In other words, LEDs have low power consumption, due to having high light conversion efficiency. Moreover, warm-up time is not required, since they are not thermal luminescence light sources, so light is able to be turned off and on quickly.

In addition, a LED is more resistant to impacts, e.g., as compared to incandescent lamps and fluorescent lamps, power consumption is low due to a stable DC lighting method, service life is semi-permanent and various color lighting effects are possible to realize, and a small size is achieved using a small light source. Due to the advantages described above, the range of applications of LEDs within the lighting field may be increased.

As described above, as the range of applications of LEDs within the lighting field has increased, there is a growing demand for LED lighting equipment. For example, light with properties similar to those of lighting equipment according to the related art can be simply provided while consuming less power. Furthermore, manufacturing costs, as compared to lighting equipment according to the related art, are reduced. Therefore, there is growing demand for lighting equipment having excellent price competitiveness.

SUMMARY

According to an example embodiment, a semiconductor light emitting device may include a plurality of light emitting cells including a first conductivity-type semiconductor layer, a second conductivity-type semiconductor layer, and an active layer disposed therebetween, and having a first surface and a second surface opposing each other, an insulating layer disposed on the second surface of the plurality of light emitting cells and having a first opening and a second opening defining a first contact region of the first conductivity-type semiconductor layer and a second contact region of the second conductivity-type semiconductor layer, respectively, a connection electrode disposed on the insulating layer and connecting a first contact region and a second contact region of adjacent light emitting cells among the plurality of light emitting cells, a transparent support substrate disposed on the first surface of the plurality of light emitting cells, and a transparent bonding layer disposed between the plurality of light emitting cells and the transparent support substrate.

According to an example embodiment, a semiconductor light emitting device may include a semiconductor stack having a first surface and a second surface opposite to each other, including a first conductivity-type semiconductor layer, a second conductivity-type semiconductor layer, and an active layer disposed therebetween, and divided into a plurality of light emitting cells by a mesa region from which the second conductivity-type semiconductor layer and the active layer are removed, the first surface and the second surface being provided by the first conductivity-type semiconductor layer and the second conductivity-type semiconductor layer, respectively, an insulating layer disposed on the second surface of the semiconductor stack and having a first opening and a second opening defining a first contact region of the first conductivity-type semiconductor layer and a second contact region of the second conductivity-type semiconductor layer, respectively, a connection electrode disposed on the insulating layer and connecting a first contact region and a second contact region of different light emitting cells to allow the plurality of light emitting cells to be electrically connected to each other, a transparent bonding layer disposed to cover the first surface of the semiconductor stack, and a transparent support substrate having a first surface bonded to the first surface of the semiconductor stack by the transparent bonding layer and a second surface opposite to the first surface.

According to an example embodiment, a LED module may include a circuit board in the form of a bar in which a first connection terminal and a second connection terminal are disposed on one side, at least one light emitting diode chip mounted on one side of the circuit board, and connected to the first connection terminal and the second connection terminal, and a wavelength conversion portion disposed in at least one side of one side of the circuit board and the other side opposite to one side. The light emitting diode chip may include: a plurality of light emitting cells including a first conductivity-type semiconductor layer, a second conductivity-type semiconductor layer, and an active layer disposed therebetween, and having a first surface and a second surface opposing each other, an insulating layer disposed on the second surface of the plurality of light emitting cells and having a first opening and a second opening defining a first contact region of the first conductivity-type semiconductor layer and a second contact region of the second conductivity-type semiconductor layer, respectively, a connection electrode disposed on the insulating layer and connecting a first contact region and a second contact region of adjacent light emitting cells among the plurality of light emitting cells, a transparent support substrate disposed on the first surface of the plurality of light emitting cells, and a transparent bonding layer disposed between the plurality of light emitting cells and the transparent support substrate.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinafter, embodiments of the present disclosure will be described in detail with reference to the accompanying drawings.

Figure 1:
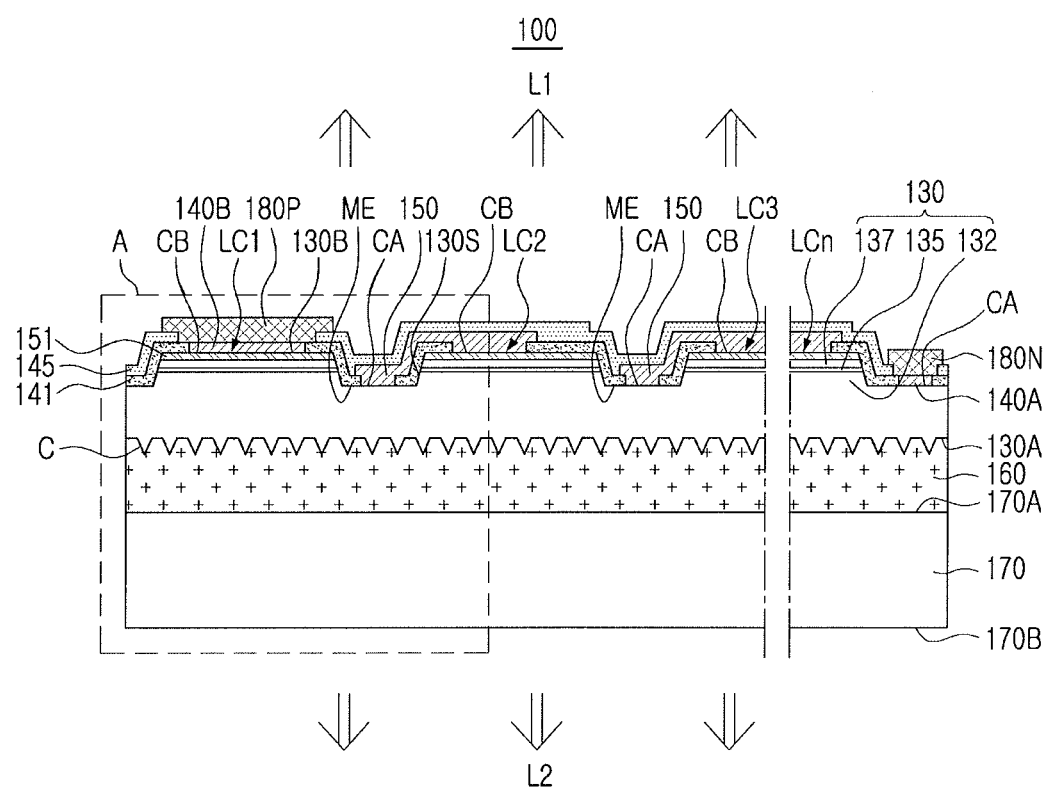
FIG. 1 illustrates a side cross-sectional view of a semiconductor light emitting device according to an example embodiment of the present disclosure.
Figure 2:
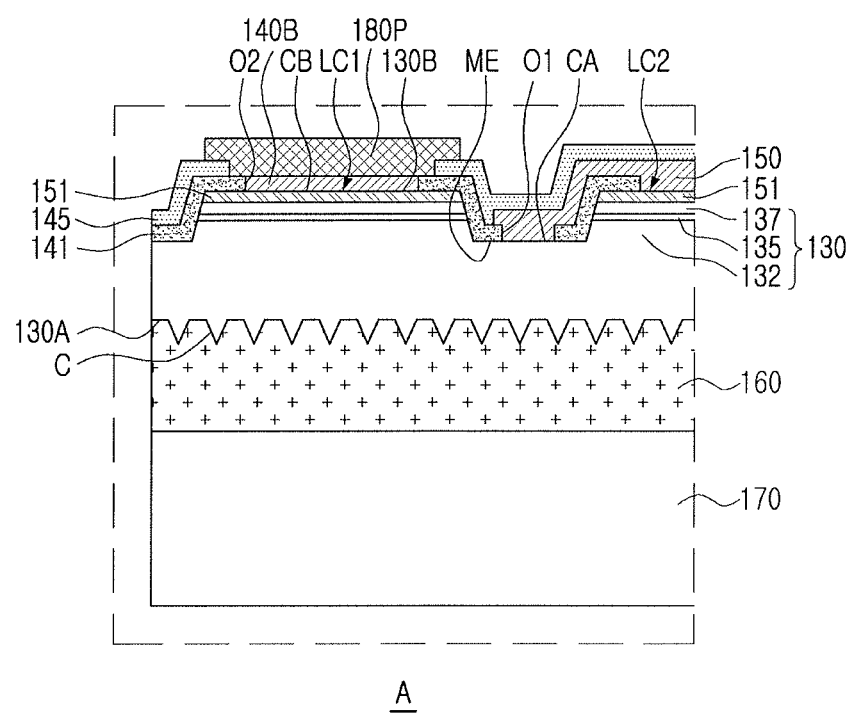
FIG. 2 illustrates a partially-enlarged view of portion A of the semiconductor light emitting device in FIG. 1.

FIG. 1 is a side cross-sectional view of a semiconductor light emitting device according to an example embodiment of the present disclosure, and FIG. 2 is a partially-enlarged view illustrating portion A of the semiconductor light emitting device illustrated in FIG. 1.

Referring to FIGS. 1 and 2, a semiconductor light emitting device 100 according to an example embodiment may include a semiconductor stack 130, a transparent support substrate 170 for supporting the semiconductor stack 130, and a transparent bonding layer 160 for bonding the semiconductor stack 130 to the transparent support substrate 170. The semiconductor light emitting device 100 is configured to emit light in an upper direction L1, in which the semiconductor stack 130 is located, and in a lower direction L2, in which the transparent support substrate 170 is located. The semiconductor light emitting device 100 may be a wafer level package in which a single light emitting diode chip implements a single package.

The semiconductor stack 130 may include a first conductivity-type semiconductor layer 132 and a second conductivity-type semiconductor layer 137, as well as an active layer 135 located therebetween. For example, the first conductivity-type semiconductor layer 132 and the second conductivity-type semiconductor layer 137, as well as the active layer 135, may constitute a hexagonal nitride semiconductor. The first conductivity-type semiconductor layer 132 may be a nitride semiconductor satisfying n-type $Al_xIn_yGa_{1-x-y}N$ ($0 \leq x \leq 1$, $0 \leq y \leq 1$, $0 \leq x+y \leq 1$), and the n-type impurity may be silicon (Si). For example, the first conductivity-type semiconductor layer 132 may be an n-type GaN. The second conductivity-type semiconductor layer 137 may be a nitride semiconductor layer satisfying p-type $Al_xIn_yGa_{1-x-y}N$, and the p-type impurity may be magnesium (Mg). For example, the second conductivity-type semiconductor layer 137 may be a p-type AlGaN/GaN. The active layer 135 may have a multiple quantum well (MQW) structure in which a quantum well layer and a quantum barrier layer are alternately stacked on each other. For example, when a nitride semiconductor is used, the active layer 135 may have a GaN/InGaN MQW structure.

The semiconductor stack 130 may have a first surface 130A and a second surface 130B provided by the first conductivity-type semiconductor layer 132 and the second conductivity-type semiconductor layer 137, respectively. For example, as illustrated in FIG. 1, the first surface 130A of the semiconductor stack 130 may be a lower surface of the first conductivity-type semiconductor layer 132 facing transparent support substrate 170, and the second surface 130B of the semiconductor stack 130 may be an upper surface of the second conductivity-type semiconductor layer 137 facing away from the active layer 135.

An unevenness portion C for improving light extraction efficiency may be formed in the first surface 130A of the semiconductor stack 130. In an example embodiment, the unevenness portion C may have a protruding portion (for example, a hexagonal pyramid) in which a cross-section is triangular, but may have various shapes as required. The unevenness portion C may be foisted by processing a surface of the first conductivity-type semiconductor layer 132. Alternatively, a buffer layer, used when the semiconductor stack 130 grows, remains, so at least a portion of the unevenness portion C may be formed. Moreover, according to an example embodiment, a reflective layer for reflecting light to the first surface 130A or the second surface 130B of the semiconductor stack 130 may be formed.

As illustrated in FIGS. 1 and 2, the semiconductor stack 130 is divided into a plurality of light emitting cells LC1 to LCn by a mesa-etched region ME. As in an example embodiment, the mesa-etched region ME may be formed not only in a region between the plurality of light emitting cells LC1 to LCn but also on the periphery of the plurality of light emitting cells LC1 to LCn, e.g., the mesa-etched region ME may surround each of the light emitting cells LC1 to LCn. A side surface 130S of the plurality of light emitting cells LC1 to LCn, having been divided, may be a surface inclined upwardly. In other words, the mesa-etched region ME may become narrower from the first surface 130A toward the second surface 130B. A shape described above may be related to an etching process for formation of the mesa-etched region ME (referring to FIG. 5).

Figure 3:
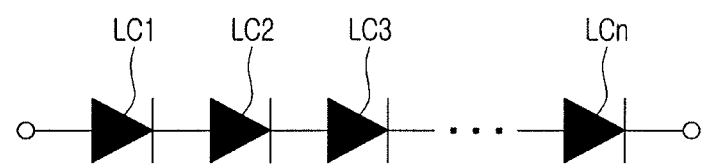
FIG. 3 illustrates a circuit diagram of the semiconductor light emitting device in FIG. 1.

In an example embodiment, as illustrated in FIG. 3, the plurality of light emitting cells LC1 to LCn are connected in series, but example embodiments are not limited thereto. Alternatively, the plurality of light emitting cells LC1 to LCn may be connected in parallel or in series-parallel.

As illustrated in FIGS. 1 and 2, the semiconductor stack 130 is divided into the plurality of light emitting cells LC1 to LCn by the mesa-etched region ME, and has a multi junction structure sharing the first conductivity-type semiconductor layer 132. For example, as illustrated in FIG. 1, the multi junction structure of the semiconductor stack 130 may include a single first conductivity-type semiconductor layer 132 that is shared by, e.g., common to, the plurality of light emitting cells LC1 to LCn. For example, as illustrated in FIG. 1, while each of the second conductivity-type semiconductor layer 137 and the active layer 135 are mesa-etched through an entire thickness thereof, the first conductivity-type semiconductor layer 132 may be only partially mesa-etched, so a bottom of the first conductivity-type semiconductor layer 132 (which faces the transparent support substrate 170) may continuously extend along the transparent support substrate 170 to connect the plurality of light emitting cells LC1 to LCn. As such, the multi-junction structure of the semiconductor stack 130 allows connections of the light emitting cells LC1 to LCn, thereby substantially reducing the number of individualized light emitting cells requiring connection to transparent support substrate 170, which in turn, reduces manufacturing costs, e.g., reduced materials (wiring/bonding) and time.

In each of the plurality of light emitting cells LC1 to LCn, not only a portion of the second conductivity-type semiconductor layer 137 but also a portion of the first conductivity-type semiconductor layer 132 may be exposed toward the second surface 130B. As illustrated in FIG. 1, portions of the second conductivity-type semiconductor layer 137 and the active layer 135 are mesa-etched, so the mesa-etched region ME, in which a portion of the first conductivity-type semiconductor layer 132 is mesa-etched, may be provided.

On the second surface 130B of the semiconductor stack 130, a wiring structure allowing the plurality of light emitting cells LC1 to LCn to be electrically connected to each other may be provided. A wiring structure employed in an example embodiment may include an insulating layer 141 formed on the second surface 130B of the semiconductor stack 130, and a connection electrode 150 for connecting a first contact region CA and a second contact region CB, of the plurality of light emitting cells LC1 to LCn, to each other.

Referring to FIG. 2, the insulating layer 141 may expose portions of the first conductivity-type semiconductor layer 132 and the second conductivity-type semiconductor layer 137, as a first opening O1 and a second opening O2, respectively, for light emitting cells LC1 and LC2. Exposed regions of the first conductivity-type semiconductor layer 132 and the second conductivity-type semiconductor layer 137 may be provided as the first contact region CA and the second contact region CB. As described above, the first opening O1 and the second opening O2 of the insulating layer 141 may define the first contact region CA and the second contact region CB, respectively. The insulating layer 141 may be, e.g., $SiO_2$, $Si_3N_4$, $HfO_2$, SiON, $TiO_2$, $Ta_2O_3$ or $SnO_2$.

As in an example embodiment, an ohmic contact layer 151 may be additionally formed on a surface of the second conductivity-type semiconductor layer 137. In this case, the second contact region CB may be provided as an exposed region of the ohmic contact layer 151. For example, the ohmic contact layer 151 may include a transparent conductive material, e.g., indium tin oxide (ITO). In the case of ITO, the ohmic contact layer 151 may have a current spreading function.

Referring to FIG. 2, the connection electrode 150 may be formed along the insulating layer 141 to allow the first contact region CA and the second contact region CB of the light emitting cells LC1 and LC2 to be connected to each other. In an example embodiment, the connection electrode 150 may be configured to allow different contact regions CA and CB of light emitting cells LC1 and LC2 adjacent to each other to be connected to each other so that the light emitting cells LC1 and LC2 are connected to each other in series. For example, the connection electrode 150 may include a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), and may have a monolayer or multilayer structure. In some example embodiments, the connection electrode 150 may include Ag or Ag/Ni.

Referring to FIG. 1, the first bonding pad 140A and the second bonding pad 140B for applying power may be formed in the first contact region CA and the second contact region CB of light emitting cells, of the plurality of light emitting cells LC1 to LCn, disposed in both ends. In other words, the first bonding pad 140A is formed in the first contact region CA of a light emitting cell LCn disposed on a right side of FIG. 1, and the second bonding pad 140B is formed in the second contact region CB disposed on a left side of a light emitting cell LC1. In addition, power is applied to the first bonding pad 140A and the second bonding pad 140B, so the plurality of light emitting cells LC1 to LCn, connected in series, may be driven.

In an example embodiment, a passivation layer 145 may be additionally disposed on the insulating layer 141 to cover the connection electrode 150. The connection electrode 150, e.g., a metal, has a problem in which bonding strength to the transparent bonding layer 160 is low. To solve the problem described above, the passivation layer 145 may be selectively introduced. Thus, when sufficient bonding strength is ensured, the passivation layer 145 may be omitted. The passivation layer 145 may be formed of a material similar to that of the insulating layer 141, e.g., at least one of $SiO_2$, $Si_3N_4$, $HfO_2$, SiON, $TiO_2$, $Ta_2O_3$, or $SnO_2$.

The transparent support substrate 170 may be disposed on the first surface 130A of the semiconductor stack 130. The transparent support substrate 170 may be a substrate for supporting the semiconductor stack 130, susceptible to damage during a manufacturing process, and may be a separate substrate replacing a growth substrate used for growing the semiconductor stack 130. An unevenness portion for improving light extraction efficiency may be formed on a second surface 170B of the transparent support substrate 170.

The transparent support substrate 170 may be bonded to the first surface 130A of the semiconductor stack 130, i.e., to the first conductivity-type semiconductor layer 132, using the transparent bonding layer 160.

The transparent support substrate 170 may be formed of a material capable of transmitting light generated in the active layer 135. For example, the transparent support substrate 170 is not limited, and may be a sapphire substrate, a SiC substrate, a Si substrate, or a glass substrate.

The transparent support substrate 170 is bonded to the semiconductor stack 130 using the transparent bonding layer 160, so it is not required for a first surface 170A and the second surface 170B of the transparent support substrate 170 to be sapphire substrates having a crystal orientation of a C-plane used for growing a semiconductor stack. Thus, the transparent support substrate 170 may be an inexpensive sapphire or Si substrate, which is not used as a substrate for semiconductor stack growth since it does not have a crystal orientation of a C-plane, even while having a large diameter such as 8 or more inches.

The transparent bonding layer 160 may be manufactured in a method in which glass is applied using a spin on glass process, in addition to an adhesive polymer. For example, the adhesive polymer may include a silicone resin, an epoxy resin, polyacrylate, polyimide, polyamide, or benzocyclobutene (BCB).

In an example embodiment, the plurality of light emitting cells LC1 to LCn are included in a single semiconductor light emitting device, so that a plurality of semiconductor light emitting devices may be replaced with a single semiconductor light emitting device. Thus, there may be an effect of significantly reducing the time required for embedding a semiconductor light emitting device in a circuit board. In addition, as a plurality of light emitting cells are disposed to be adjacent to each other, compared to the case in which a plurality of semiconductor light emitting devices are disposed to be spaced apart from each other by a predetermined distance, there may be an effect of significantly reducing an area of the circuit board in which the semiconductor light emitting device is embedded. In addition, as the time for dicing the plurality of semiconductor light emitting devices into discrete devices is not required, there may be an effect of reducing the time required for manufacturing a semiconductor light emitting device. As described above, as the time for manufacturing a semiconductor light emitting device according to an example embodiment is significantly reduced, there may be an effect of reducing manufacturing costs.

In an example embodiment, a structure having light transmissivity (for example, the transparent support substrate 170) and the transparent bonding layer 160 may be provided on the first surface 130A of the semiconductor stack 130, and light may be emitted toward the second surface 130B opposite to the first surface, so light may be emitted not only in the upper direction L1 but also in the lower direction L2. The light emitting device 100 described above, for example, a top-emission light emitting device or a dual emission light emitting device, may be advantageously applied to various lighting devices (referring to FIGS. 13, 15, 16, 27, 28, and 29).

FIGS. 4 through 12 are cross-sectional views of stages in a method of manufacturing the semiconductor light emitting device illustrated in FIG. 1. A process described below may be performed on a wafer level.

Figure 4:
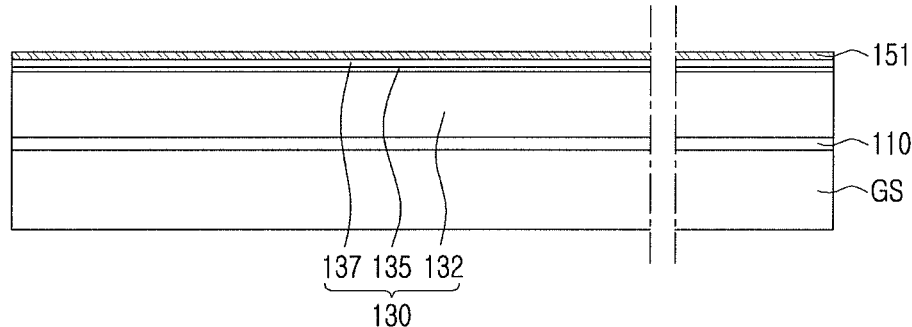
FIGS. 4 through 12 illustrate cross-sectional views of stages in a method of manufacturing the semiconductor light emitting device in FIG. 1.

Referring to FIG. 4, a buffer layer 110 is formed on a growth substrate GS, and the semiconductor stack 130 for a plurality of light emitting cells is formed on the buffer layer 110. The growth substrate GS is provided as a substrate for semiconductor growth, and insulating, conductive, and semiconductor materials, e.g., sapphire, SiC, $MgAl_2O_4$, MgO, $LiAlO_2$, $LiGaO_2$, GaN, or the like, may be used. If a sapphire is used for the growth substrate GS, the crystal body may have Hexa-Rhombo R3c symmetry, the lattice constants in the c-axis direction and in the a-axis direction may be 13.001 Å and 4.758 Å, respectively, and the sapphire may have a C(0001) plane, an A(11-20) plane, a R(1-102) plane, or the like. In this case, the C plane is mainly used as a substrate for nitride growth as a nitride thin film grows relatively easily therein and the C plane is stable at high temperatures. However, a sapphire substrate for semiconductor growth having the C plane may be difficult to grow to have a large diameter, e.g., a diameter of 8 inches or larger, and may be relatively expensive. Farther, if Si is used as the growth substrate GS, it may be possible to have a large diameter , e.g., a dimeter of 8 inches or more, and costs may be relatively low, so mass productivity may be improved.

The buffer layer 110 may be $In_xAl_yGa_{1-x-y}N$ ($0 \le x \le 1$, $0 \le y \le 1$). For example, the buffer layer 110 may be AlN, AlGaN, or InGaN. As required, the buffer layer may be used, as a plurality of layers are combined or a composition is gradually changed. When the growth substrate is a silicon (Si) substrate and allows a nitride semiconductor to grow as the semiconductor stack 130, the buffer layer 110 may have various types of composite buffer structure.

The semiconductor stack 130 may include the first conductivity-type semiconductor layer 132, the active layer 135, and the second conductivity-type semiconductor layer 137. Each layer of the semiconductor stack 130 may be a nitride semiconductor previously described in the example embodiment, and may grow on the growth substrate GS using, e.g., metalorganic chemical vapor deposition (MOCVD), molecular beam epitaxy (MBE), or hydride vapor phase epitaxial (HYPE). The ohmic contact layer 151 may be additionally formed on the second conductivity-type semiconductor layer 137. For example, the ohmic contact layer 151 may be an ITO.

Figure 5:
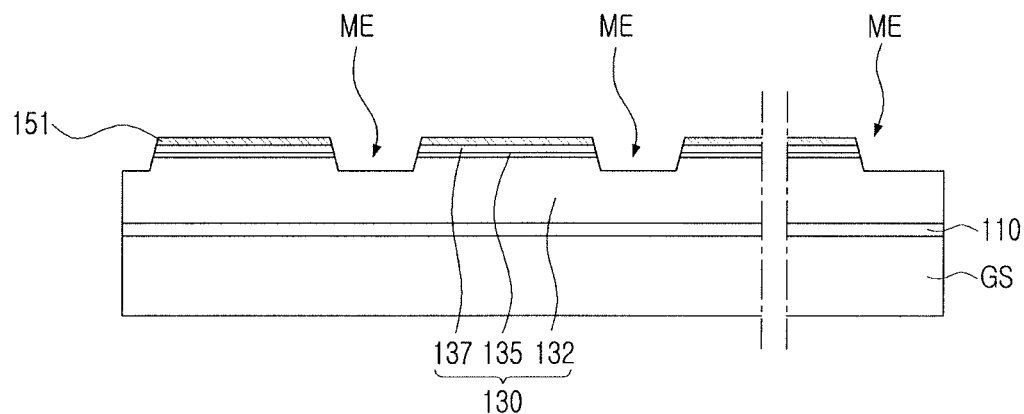

Next, referring to FIG. 5, in order to expose a portion of the first conductivity-type semiconductor layer 132 in the semiconductor stack 130, portions of the second conductivity-type semiconductor layer 137 and the active layer 135 are removed to form the mesa-etched region ME. Depending on a process, a portion of the first conductivity-type semiconductor layer 132 may be removed in a process of forming the mesa-etched region ME. In the process described above, a mesa structure is formed in the second conductivity-type semiconductor layer 137 and the active layer 135, and the mesa structure described above may be defined as a region for dividing a light emitting cell in a subsequent process.

Figure 6:
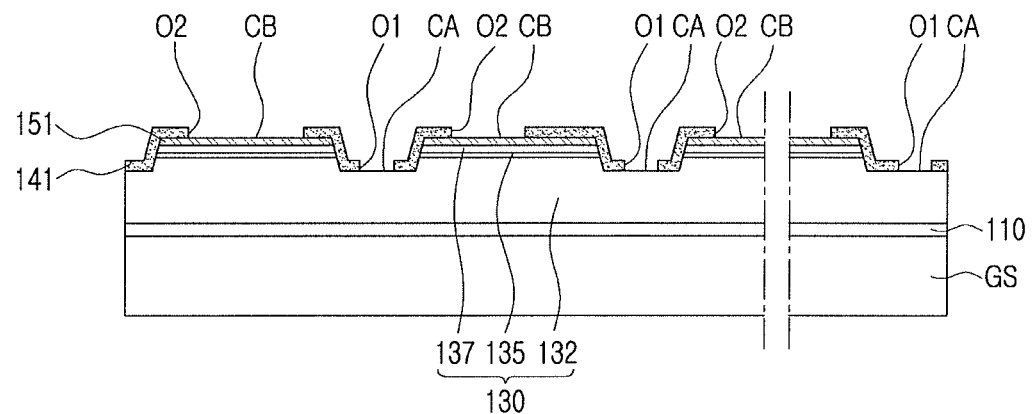

Next, referring to FIG. 6, the insulating layer 141 having the first opening O1 and the second opening O2 is formed on the semiconductor stack 130. A process described above may be performed as a process in which, after an insulating layer 141 is formed in the entirety of an upper surface of the semiconductor stack 130, the first opening O1 and the second opening O2 are formed using a mask. The first opening O1 and the second opening O2 define the first contact region CA and the second contact region CB in the first conductivity-type semiconductor layer 132 and the second conductivity-type semiconductor layer 137, respectively. For example, the insulating layer 141 may be $SiO_2$, $Si_3N_4$, $HfO_2$, SiON, $TiO_2$, $Ta_2O_3$, or $SnO_2$.

Figure 7:
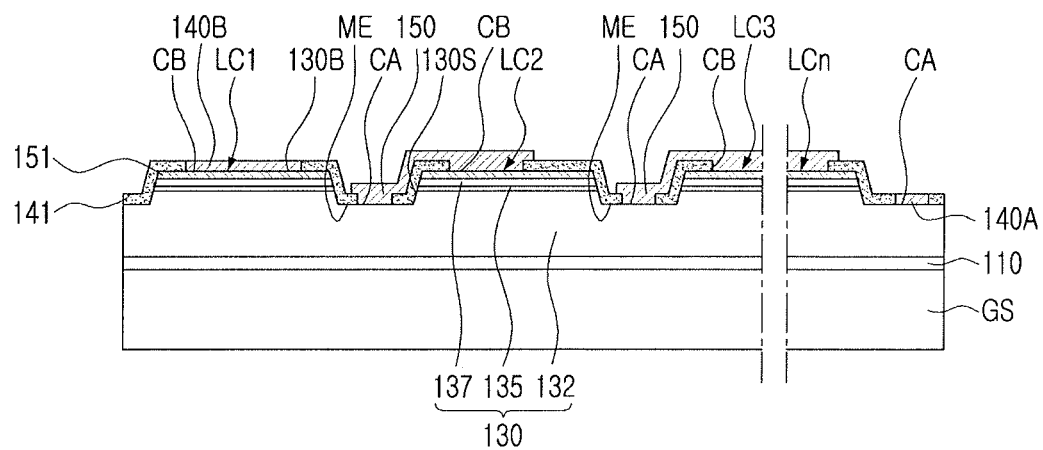

Next, referring to FIG. 7, the connection electrode 150 for connecting the first contact region CA and the second contact region CB of the plurality of light emitting cells LC1 to LCn may be provided. The connection electrode 150 is formed along the insulating layer 141, thereby preventing unintended connections between the connection electrode 150 and the semiconductor stack 130 from occurring.

In a process described above, the connection electrode 150 may connect different contact regions CA and CB of adjacent light emitting cells LC in order to drive the plurality of light emitting cells LC1 to LCn in series. For example, the connection electrode 150 may include Ag, Ni, Al, Rh, Pd, Ir, Ru, Mg, Zn, Pt, or Au.

In addition to the connection electrode 150, the first bonding electrode 140A and the second bonding pad 140B may be formed on the light emitting cells LC1 and LCn located at both ends of the semiconductor stack 130, respectively. The first bonding pad electrode 140A and the second bonding pad 140B may provide a region in which a connection pad is to be formed in a subsequent process.

Figure 8:
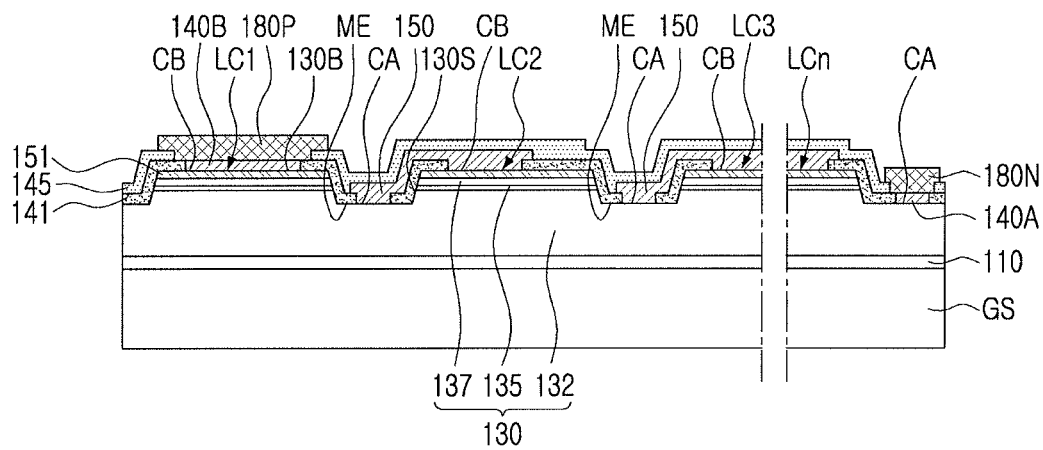

Next, referring to FIG. 8, the passivation layer 145 is formed on the insulating layer 141 to cover the connection electrode 150, and a first electrode pad 180N and a second electrode pad 180P may be provided. As described previously, the passivation layer 145 is introduced, so bonding strength to the transparent bonding layer 160 to be subsequently formed may be strengthened. The passivation layer 145 may be formed by depositing a material such as the insulating layer 141. For example, the passivation layer 145 may be $SiO_2$, $Si_3N_4$, $HfO_2$, SiON, $TiO_2$, $Ta_2O_3$, or $SnO_2$.

Figure 9:
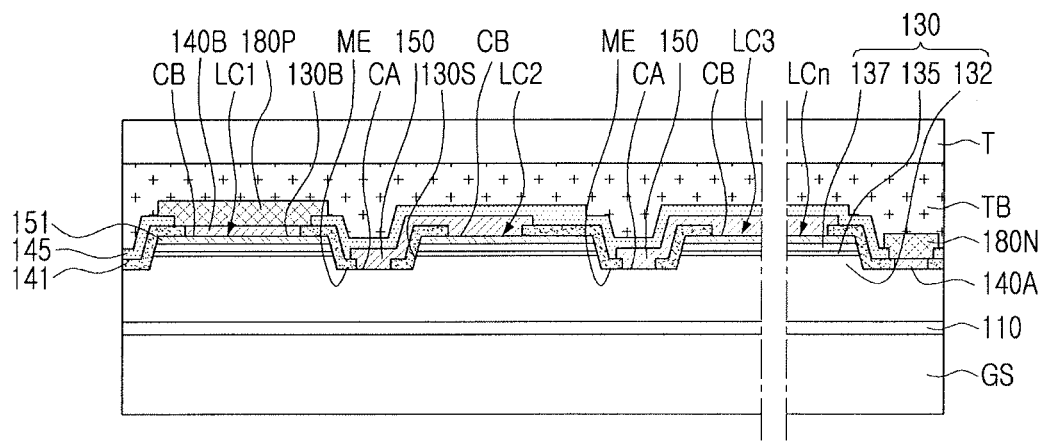

Next, referring to FIG. 9, a temporary adhesive layer TB is applied to the second surface 130B of the semiconductor stack 130, and a tape T, used as a support in a subsequent process of removing the growth substrate GS, is attached thereto. The temporary adhesive layer TB may be an adhesive capable of maintaining strength at a level sufficient to support the semiconductor stack 130 while being quickly cured, e.g., a UV curing resin.

Figure 10:
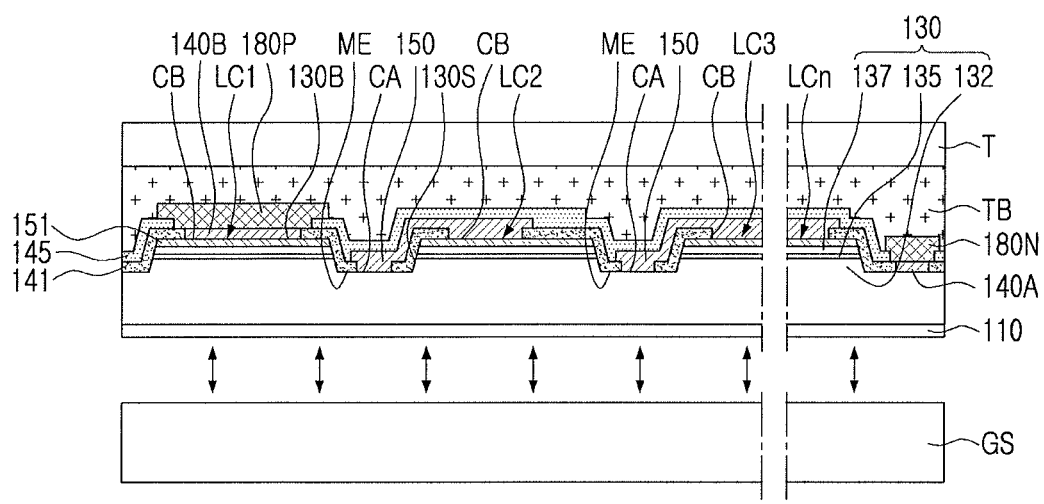

Next, referring to FIG. 10, the growth substrate GS may be removed from the semiconductor stack 130. Removal of the growth substrate GS may be performed in various processes, e.g., laser lift off, mechanical polishing, chemical mechanical polishing, or chemical etching. When a silicon substrate is used as the growth substrate GS, mechanical strength is relatively low, so the growth substrate may be removed using a mechanical or mechanical chemical polishing process. In an example embodiment, the buffer layer 110 remains on the first conductivity-type semiconductor layer 132 by way of example, but an example embodiment is not limited thereto. In another example embodiment, the buffer layer 110 may be removed with the growth substrate GS.

Figure 11:
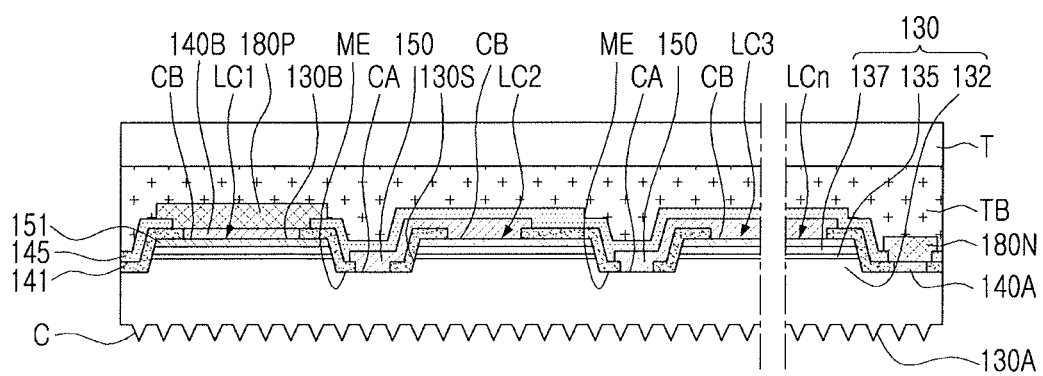

Next, referring to FIG. 11, a surface treatment process of forming the unevenness portion C in the first conductivity-type semiconductor layer 132 may be performed. In an example embodiment, the unevenness portion C is formed in a surface of the first conductivity-type semiconductor layer 132 by way of example, but an example embodiment is not limited thereto. In another example embodiment, the unevenness portion C may be formed in the buffer layer 110 remaining in the first conductivity-type semiconductor layer 132.

Figure 12:
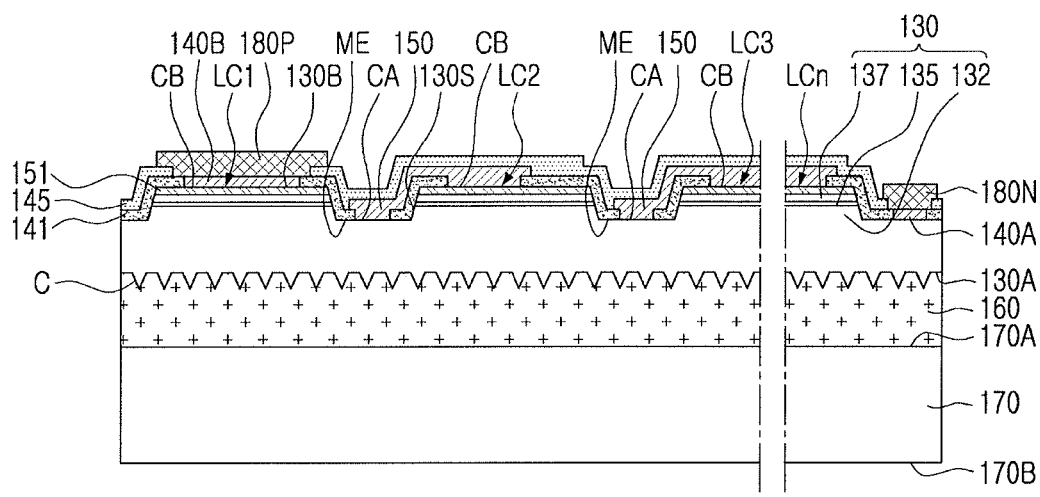

Next, referring to FIG. 12, the transparent bonding layer 160 is applied to the first surface 130A of the first conductivity-type semiconductor layer 132, and the transparent support substrate 170 may be bonded thereto. After the transparent support substrate 170 is bonded, the temporary adhesive layer TB and the tape T formed in a previous process as a support may be removed therefrom (referring to FIG. 11).

The transparent bonding layer 160 may be applied to cover the unevenness portion C so as to allow an applied surface to be a flat surface. The transparent bonding layer 160 may include, e.g., silicone resin, epoxy resin, polyacrylate, polyimide, polyamide, or benzocyclobutene (BCB). In addition to the polymer described above, the transparent support substrate 170 may be bonded thereto using a spin-on-glass method.

The transparent support substrate 170 may be bonded to the first surface 130A of the semiconductor stack 130 using the transparent bonding layer 160. The transparent support substrate 170 may be a material capable of transmitting light generated in the active layer 135. For example, the transparent support substrate 170 is not limited, and may be one of a sapphire substrate, a SiC substrate, Si, and a glass substrate. The transparent support substrate 170 is provided to support a semiconductor stack. Here, when the sapphire substrate is used, it is not required to have a crystal orientation of a C-plane used for growing a semiconductor stack. Thus, the transparent support substrate 170 may be applied to a relatively inexpensive sapphire substrate, e.g., a sapphire substrate with a diameter of about 8 inches or more, which does not have a crystal orientation of a C-plane, or a Si substrate.

As needed, a grinding process may be performed to reduce a thickness of the transparent support substrate 170 to a desired thickness. In a specific example embodiment, at least one of the transparent bonding layer 160 and the transparent support substrate 170 may be provided as a wavelength conversion portion by containing a wavelength converting material for converting a wavelength of emitted light.

A semiconductor light emitting device according to example embodiments described above has a structure capable of emitting light laterally or from a top surface, and may be advantageously used as various LED modules and lighting devices.

Figure 13:
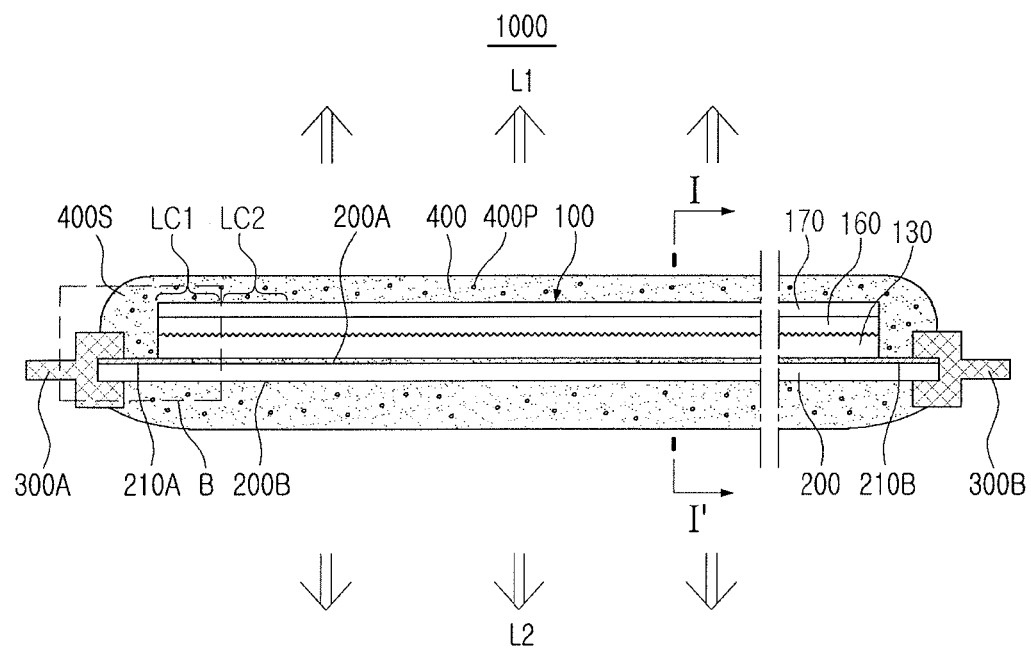
FIG. 13 illustrates a side cross-sectional view of a LED module according to an example embodiment of the present disclosure.
Figure 14:
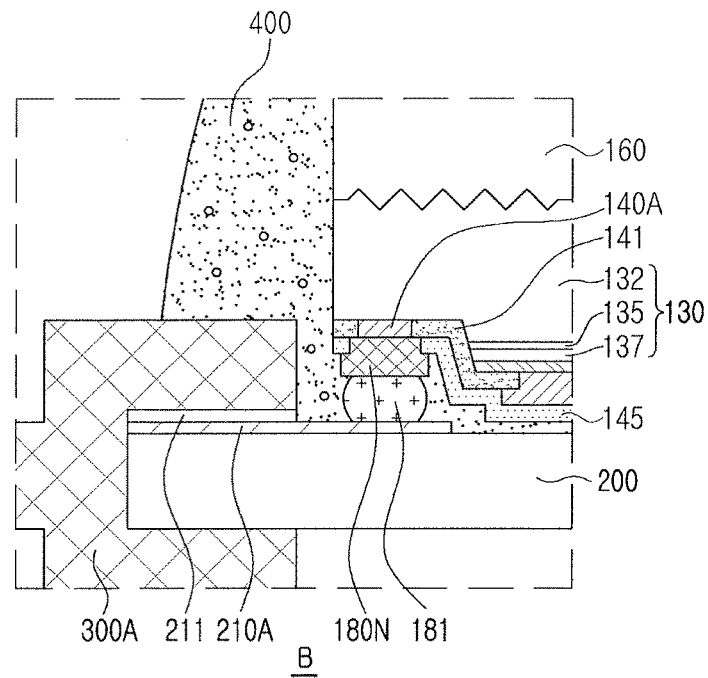
FIG. 14 illustrates a partially-enlarged view of portion B of the LED module illustrated in FIG. 13.

FIG. 13 is a side cross-sectional view illustrating a LED module according to an example embodiment of the present disclosure, and FIG. 14 is a partially-enlarged view illustrating portion B of the LED module illustrated in FIG. 13.

Referring to FIGS. 13 and 14, a LED module 1000 may have an elongated rod shape in which a first connection terminal 300A and a second connection terminal 300B are exposed to both ends, respectively, and a middle is covered with a wavelength conversion portion 400. In detail, the LED module 1000 may include the semiconductor light emitting device 100 illustrated in FIGS. 1 and 2, a circuit board 200, in which the semiconductor light emitting device 100 is embedded, the wavelength conversion portion 400 surrounding the semiconductor light emitting device 100, as well as the first connection terminal 300A and the second connection terminal 300B connected to the semiconductor light emitting device 100 and provided for applying power. The LED module 1000 is manufactured to have a shape similar to that of a filament of an incandescent lamp according to the related art. When power is applied, a linear light fixture emits light in a manner similar to that of a filament, e.g., a rod (see, e.g., circular cross-section in FIG. 17), so it is referred to as a LED filament.

The circuit board 200 may have a first surface 200A and a second surface 200B, as well as a first electrode 210A and a second electrode 210B connected to a surface in which the semiconductor light emitting device 100 is embedded. For example, as illustrated in FIGS. 13-14, the first and second electrodes 210A and 210B, as well as the semiconductor light emitting device 100, may be on the first surface 200A of circuit board 200. For example, as illustrated in FIGS. 13-14, the circuit board 200 may have a shape of a bar elongated in one direction, and the first and second electrodes 210A and 210B may be on the first surface 200A of the bar-shaped circuit board 200, e.g., spaced apart from each other to be on opposite sides of the circuit board 200 with the semiconductor light emitting device 100 therebetween.

A first bonding pad and a second bonding pad of the semiconductor light emitting device 100 may be connected to the first electrode 210A and the second electrode 210B by a solder 181. A thermal paste for improving thermal conductivity may be applied or a metal layer may be deposited in regions of the first electrode 210A and the second electrode 210B, connected to the first connection terminal 300A and the second connection terminal 300B. The thermal paste may include a diamond with good thermal conductivity, and a filler of, e.g., Ag, AlN, BN, and ZnO, and the metal layer may include, e.g., Au, Sn, Ag, Al, W, Ni, Cu, In, and Pb.

Thus, heat emitted from the semiconductor light emitting device 100 may be rapidly dissipated to the first connection terminal 300A and the second connection terminal 300B through the first electrode 210A and the second electrode 210B.

The circuit board 200 may be a transparent substrate manufactured using, e.g., glass, hard glass, quartz glass, a transparent ceramic, sapphire, plastic, or the like. According to an example embodiment, the circuit board 200 may be formed of the same material as that of the transparent support substrate 170 of the semiconductor light emitting device 100. According to an example embodiment, an unevenness portion for improving light extraction efficiency may be formed in the second surface 200B of the circuit board 200.

The first connection terminal 300A and the second connection terminal 300B are disposed at both ends of the circuit board 200 to be connected to the first electrode 210A and the second electrode 210B of the circuit board 200, respectively. The first connection terminal 300A and the second connection terminal 300B may be connected to the first electrode 210A and the second electrode 210B by a solder, but an example embodiment is not limited thereto. Alternatively, the first connection terminal 300A and the second connection terminal 300B may be connected to the first electrode 210A and the second electrode 210B by compression.

Figure 17:
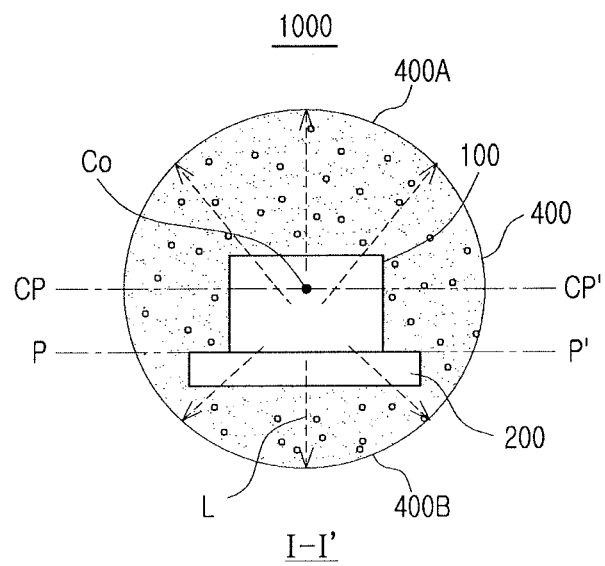
FIG. 17 illustrates a front cross-sectional view taken along line I-I' of FIG. 13.

The wavelength conversion portion 400 may be formed to cover not only the first surface 200A of the circuit board 200, in which the semiconductor light emitting device 100 is embedded, but also the second surface 200B. In an example embodiment, the wavelength conversion portion 400 may be formed to surround the circuit board 200 while covering the semiconductor light emitting device 100 located on an upper surface of the transparent support substrate 170, e.g., the wavelength conversion portion 400 may completely surround the circuit board 200 with the semiconductor light emitting device 100 (FIG. 17). Thus, all light L1 and L2 emitted in both directions may be converted into desired light by the wavelength conversion portion 400.

The wavelength conversion portion 400 may include a wavelength conversion material 400P, e.g., a phosphor or a quantum dot, and a transparent resin 400S containing the same. For example, the wavelength conversion material 400P may convert a portion of light generated in the active layer 135 into light of a different wavelength. The wavelength conversion material 400P may be formed to obtain final emitted light as white light. In an example, the wavelength conversion material 400P may include two or more wavelength conversion materials, e.g., at least one of a green phosphor, a yellow phosphor, and a red phosphor.

Figure 15:
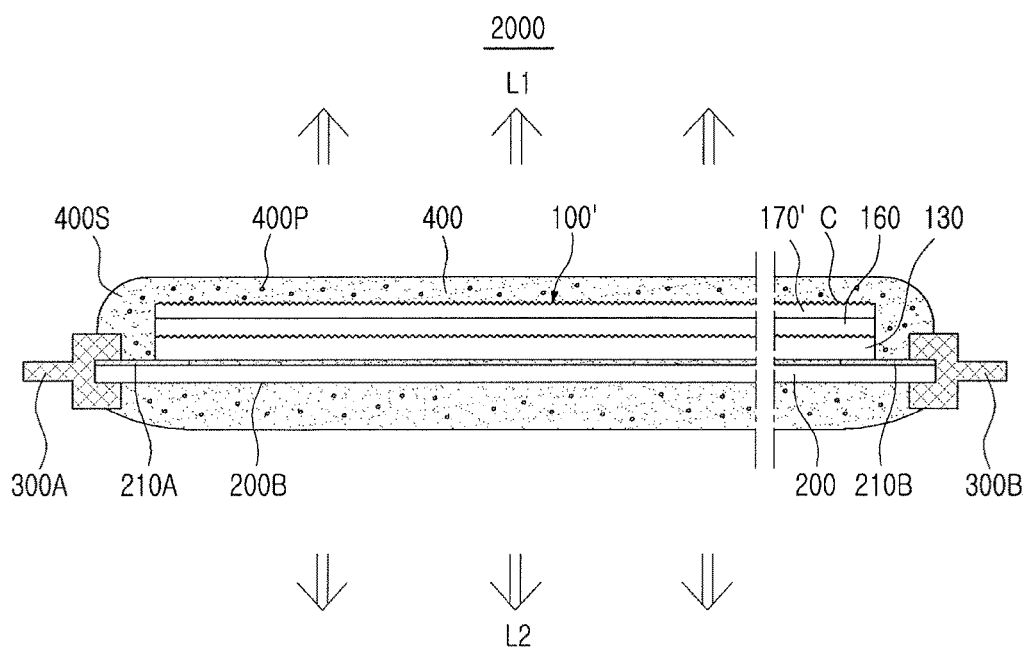
FIGS. 15 and 16 illustrate modified examples of the LED module of FIG. 13.
Figure 16:
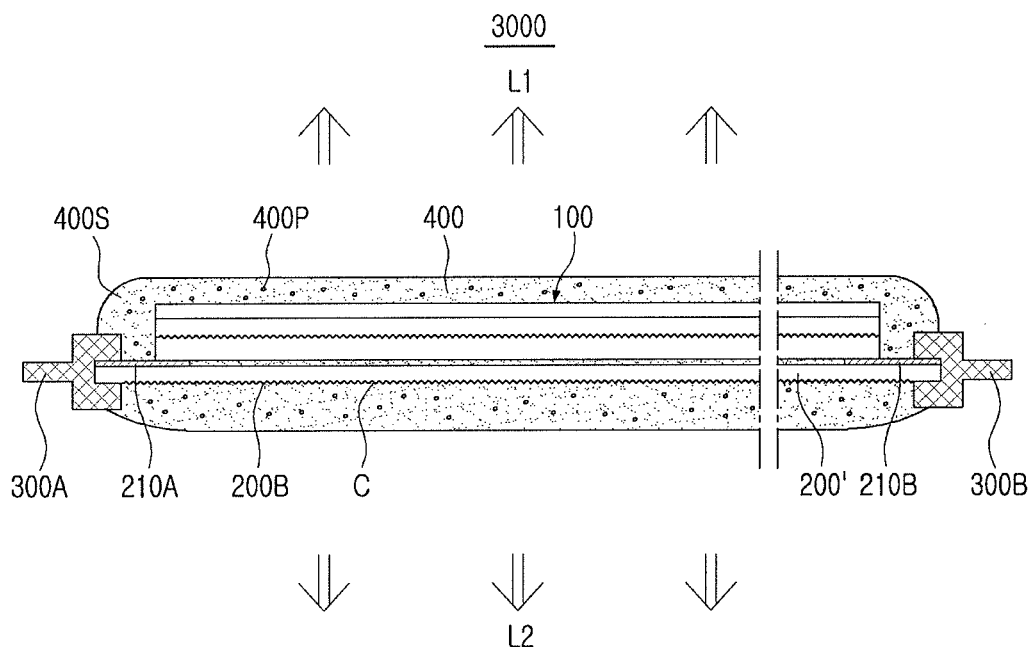

In FIGS. 15 and 16, a LED module having a different structure from the example embodiment described previously is illustrated. Referring to FIG. 15, a LED module 2000 according to an example embodiment may include a semiconductor light emitting device 100' and a circuit board 200 similar to the example embodiment described previously, as well as a wavelength conversion portion 400 surrounding the semiconductor light emitting device 100'. The wavelength conversion portion 400 may be formed in a manner similar to the wavelength conversion portion 400 illustrated in FIG. 13.

Compared to the previous example embodiment (referring to FIG. 13), there is a difference in that the unevenness portion C is formed to improve light extraction efficiency in an upper surface of a transparent support substrate 170' of the semiconductor light emitting device 100'. The unevenness portion C formed in the transparent support substrate 170' prevents light emitted from the semiconductor light emitting device 100' from being totally internally reflected from an interface between the wavelength conversion portion 400 and the transparent support substrate 170', thereby improving light extraction efficiency. In addition, an area in which the semiconductor light emitting device 100' and the wavelength conversion portion 400 are in contact with each other is increased, e.g., due to the unevenness portion C, thereby rapidly emitting heat, emitted from the semiconductor light emitting device 100', to a surface of the LED module 2000. FIG. 16 illustrates an example in which the unevenness portion C is formed in the second surface 200B of a circuit board 200'.

FIG. 17 is a cross-sectional view taken along line I-I' of the LED module 1000 of FIG. 13. A mounting surface P-P', from which an upper surface of the circuit board 200 is extended, is disposed lower than a surface CP-CP' passing through the center C0 of the wavelength conversion portion 400, so an area of a surface of a front portion 400A of the wavelength conversion portion 400 (e.g., above the semiconductor light emitting device 100) may be arranged to be wider than an area of a surface of a rear portion 400B (e.g., below the circuit board 200). Using the arrangement described above, an amount of light L emitted to an upper portion and a lower portion of the LED module 1000 may be adjusted.

Figure 18:
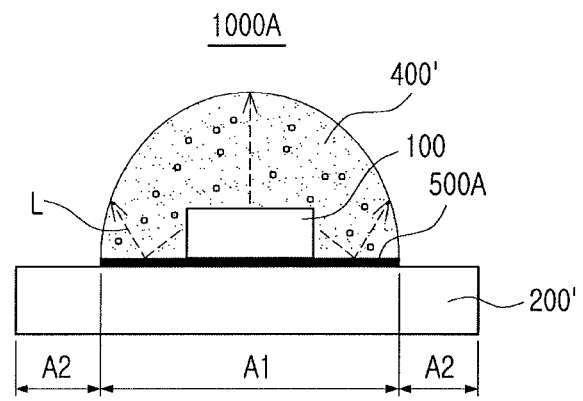
FIGS. 18 through 20 illustrate modified examples of the LED module of FIG. 13.
Figure 19:
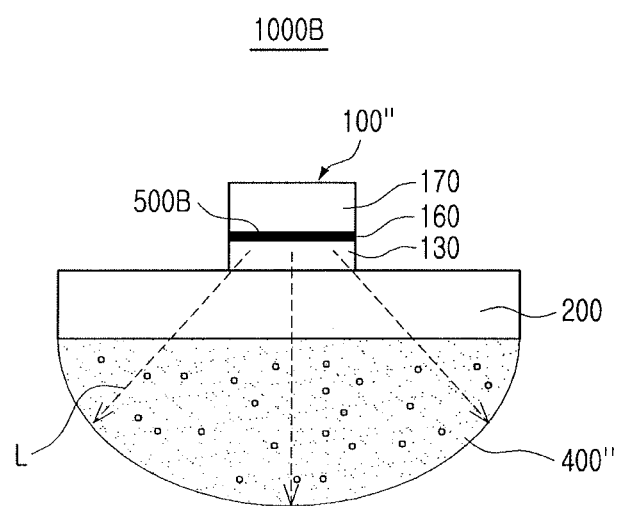
Figure 20:
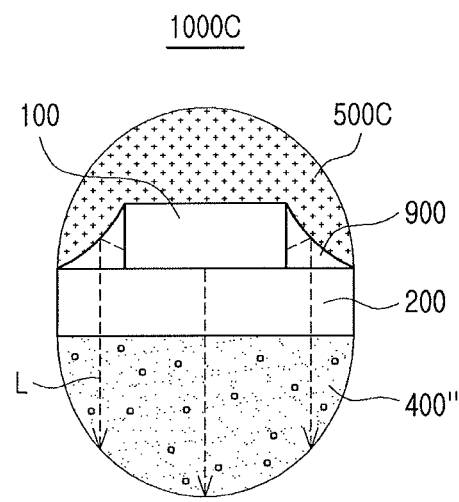

FIGS. 18 through 20 illustrate a LED module having a wavelength conversion portion with a different structure form the example embodiment described previously.

Referring to FIG. 18, a LED module 1000A according to an example embodiment may include the semiconductor light emitting device 100 and the circuit board 200' according to the example embodiment described previously, as well as a wavelength conversion portion 400' surrounding the semiconductor light emitting device 100. The wavelength conversion portion 400' may be formed in a manner similar to the wavelength conversion portion 400 illustrated in FIG. 17.

Compared to the previous example embodiment (referring to FIG. 17), there are differences in that the wavelength conversion portion 400' is only formed in a portion A1 of one surface of the circuit board 200', in which the semiconductor light emitting device 100 is embedded, so both regions A2 of the circuit board 200' are exposed, i.e., without the wavelength conversion portion 400', and a reflective layer 500A is disposed on the circuit board 200'. Light L emitted from the semiconductor light emitting device 100 is reflected from the reflective layer 500A, and is then emitted from a top surface, so the wavelength conversion portion 400' may only be formed in a surface in which the semiconductor light emitting device 100 is embedded. Thus, an amount of a wavelength conversion material used for formation of the wavelength conversion portion 400' is reduced, so manufacturing costs may be reduced. In addition, a region in which the circuit board 200' is exposed to air is increased, and a region in which the wavelength conversion portion 400' having low heat efficiency is formed is reduced, so heat efficiency of the LED module 1000A may be increased.

Referring to FIG. 19, a LED module 1000B according to an example embodiment may include a semiconductor light emitting device 100" and a circuit board 200 similar to the example embodiment described previously as well as a wavelength conversion portion 400" covering a surface in which the semiconductor light emitting device 100" is not embedded. The wavelength conversion portion 400" may be formed in a manner similar to the wavelength conversion portion 400 illustrated in FIG. 17.

Compared to the previous example embodiment (referring to FIG. 18), there are differences in that the wavelength conversion portion 400" is formed in only a surface in which the semiconductor light emitting device 100" is not embedded, and a reflective layer 500B is disposed inside the semiconductor light emitting device 100". Similar to the example embodiment of FIG. 18, light L emitted from the semiconductor light emitting device 100" is reflected from the reflective layer 500B, and is then emitted through the circuit board 200, so the wavelength conversion portion 400" may only be formed in a surface in which the semiconductor light emitting device 100" is not embedded. Thus, an amount of a wavelength conversion material used for formation of the wavelength conversion portion 400" is reduced, so manufacturing costs may be reduced. In addition, a region in which the circuit board 200 is exposed to air is increased, and a region in which the wavelength conversion portion 400" having low heat efficiency is formed is reduced, so heat efficiency of the LED module 1000B may be increased.

Referring to FIG. 20, a LED module 1000C according to an example embodiment may include the semiconductor light emitting device 100 and the circuit board 200 similar to the example embodiment described previously, as well as a wavelength conversion portion 400" covering a surface in which the semiconductor light emitting device 100 is not embedded.

Compared to the previous example embodiment (referring to FIG. 19), there are differences in that a transparent resin layer 900 covering a side surface of the semiconductor light emitting device 100 is further included, and a reflective layer 500C is formed to cover the transparent resin layer 900 and the semiconductor light emitting device 100. As the reflective layer 500C is disposed in a lateral direction of the semiconductor light emitting device 100, so light L emitted in a lateral direction from the semiconductor light emitting device 100 may be emitted through the circuit board 200 and the wavelength conversion portion 400". Thus, light extraction efficiency of the LED module 1000C may be further improved.

Figure 21:
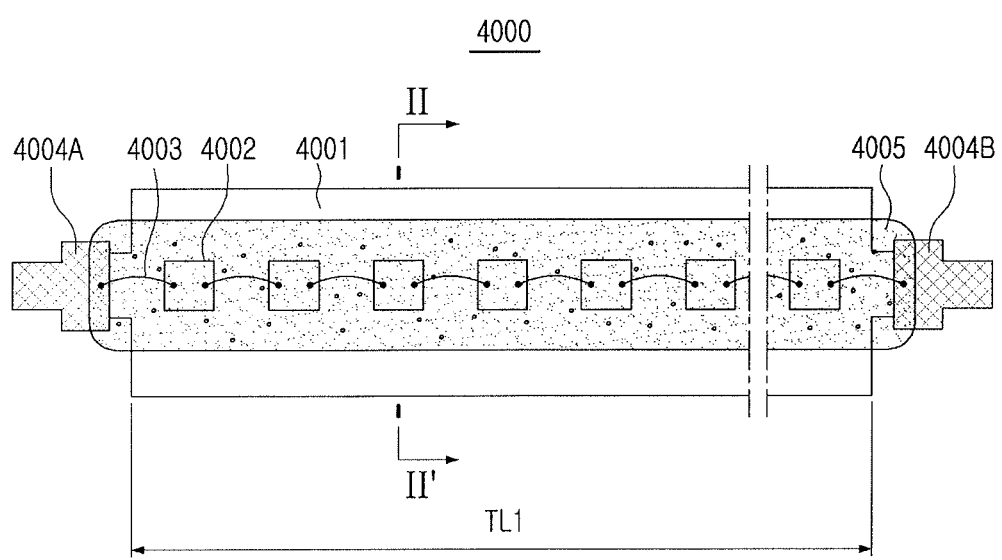
FIG. 21 illustrates a plan view of a LED module according to an example embodiment of the present disclosure.
Figure 22:
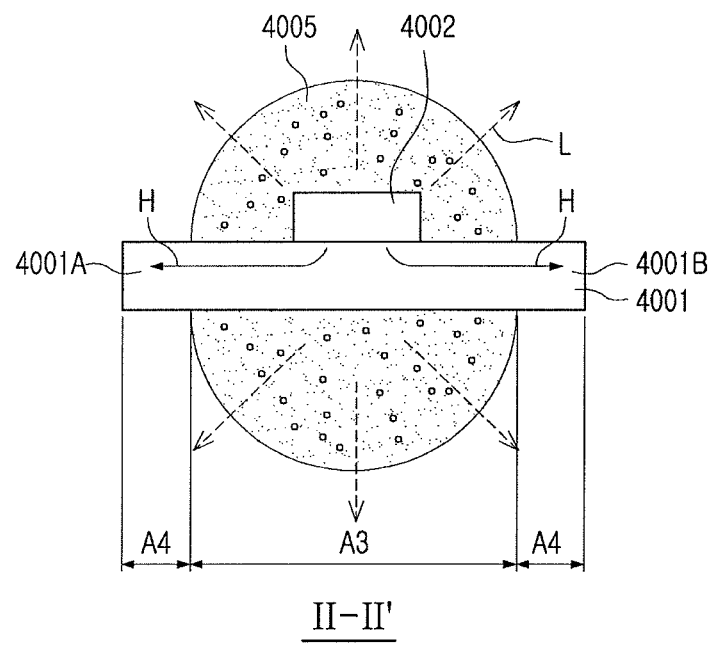
FIG. 22 illustrates a side cross-sectional view taken along line II-II' of FIG. 21.
Figure 23:
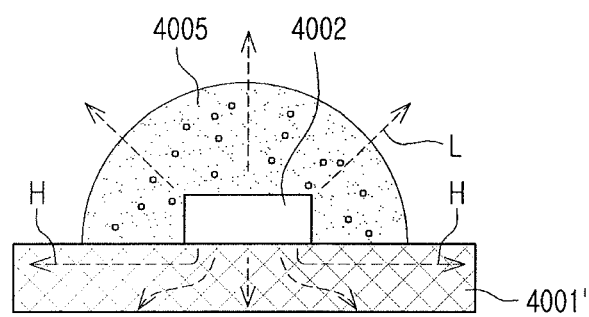
FIG. 23 illustrates a modified example of the LED module of FIG. 21.
Figure 24:
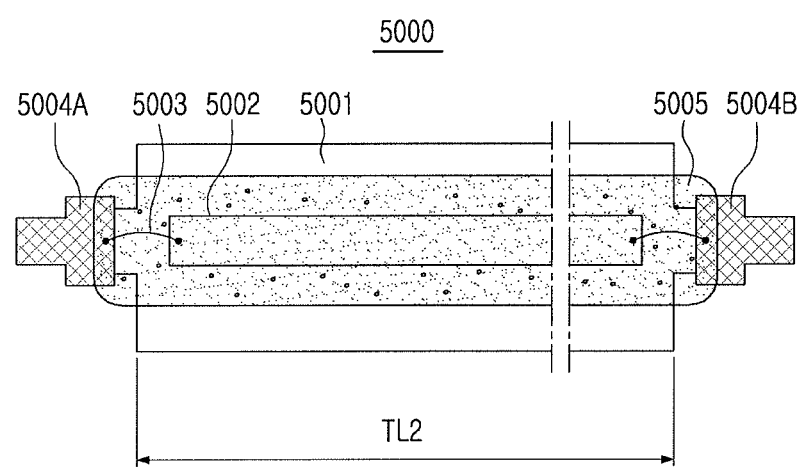
FIG. 24 illustrates a modified example of the LED module of FIG. 21.

FIG. 21 is a plan view of a LED module according to an example embodiments of the present disclosure, FIG. 22 is a side cross-sectional view taken along line II-II' of FIG. 21, while FIGS. 23 and 24 illustrate modified examples of the LED module of FIG. 21.

Referring to FIG. 21, a LED module 4000 according to an example embodiment may include a circuit board 4001, a plurality of semiconductor light emitting devices 4002 embedded in one surface of the circuit board 4001, a wavelength conversion portion 4005 surrounding the plurality of semiconductor light emitting devices 4002, as well as a first connection terminal 4004A and a second connection terminal 4004B electrically connected to the semiconductor light emitting device 4002 for applying power. The wavelength conversion portion 4005 may be formed in a manner similar to the wavelength conversion portion 400 illustrated in FIG. 13.

The plurality of semiconductor light emitting devices 4002 are similar to the semiconductor light emitting device 100 of FIG. 13, but there is a difference in that each of the plurality of semiconductor light emitting devices 4002 is formed of a single light emitting cell, thereby not having a multi junction structure. In addition, the plurality of semiconductor light emitting devices 4002 may be connected in series, in parallel, or in series-parallel through connection of a wire 4003, but an example embodiment is not limited thereto. Alternatively, a circuit wiring is printed on the circuit board 4001, and the plurality of semiconductor light emitting devices, in chip on board (COB) form, may be directly mounted on the circuit wiring without a separate package. In an example embodiment, the case in which the plurality of semiconductor light emitting devices 4002 are connected in series through the wire 4003 is exemplified.

The circuit board 4001 may be formed as a transparent substrate in a manner similar to the circuit board 200 illustrated in FIG. 13, but may be formed of a metal substrate having excellent heating properties according to an example embodiment. Moreover, referring to FIG. 22, in the circuit board 4001, regions A4 except for a region A3 in which the wavelength conversion portion 4005 is disposed. That is, both ends 4001A and 4001B in a width direction of the circuit board 4001 are exposed to air, e.g., regions A4 of the circuit board 4001 are not covered by the wavelength conversion portion 4005, so heat H emitted from the semiconductor light emitting device 4002 may be rapidly dissipated.

FIG. 23 illustrates a modified example of the LED module illustrated in FIG. 22. When compared to the example embodiment of FIG. 22, there is a difference in that a circuit board 4001' is formed of a metal. The circuit board 4001' may be formed of one of Cu, Au, Ag, and Al, or alloys thereof. When the circuit board 4001' is formed of a metal, heat H emitted from the semiconductor light emitting device 4002 is rapidly dissipated, so heat dissipation efficiency may be improved. Moreover, light emitted from the semiconductor light emitting device 4002 is reflected to the top surface of the semiconductor light emitting device 4002 without a separate reflector, so light extraction efficiency may be improved. In addition, the wavelength conversion portion 4005 is only disposed in a surface in which the semiconductor light emitting device 4002 is embedded, so manufacturing costs may be reduced, as compared to the case in which a wavelength conversion portion is formed to surround a circuit board.

FIG. 24 illustrates a modified example of the LED module illustrated in FIG. 22. When compared to the example embodiment of FIG. 22, there is a difference in that a semiconductor light emitting device 5002 has the multi junction structure described previously. When a plurality of semiconductor light emitting devices are replaced with a single semiconductor light emitting device 5002 having a multi-junction structure, a length of a LED module becomes shorter than a length of a LED module having the same number of light emitting cells, so manufacturing costs may be reduced. When compared to the example embodiment of FIG. 21, a length TL2 of a LED module 5000 of FIG. 24 is shorter than a length TL1 of the LED module 4000 of FIG. 21, so costs required to manufacture the circuit board 5001 and the wavelength conversion portion 5005 may be reduced.

Figure 25:
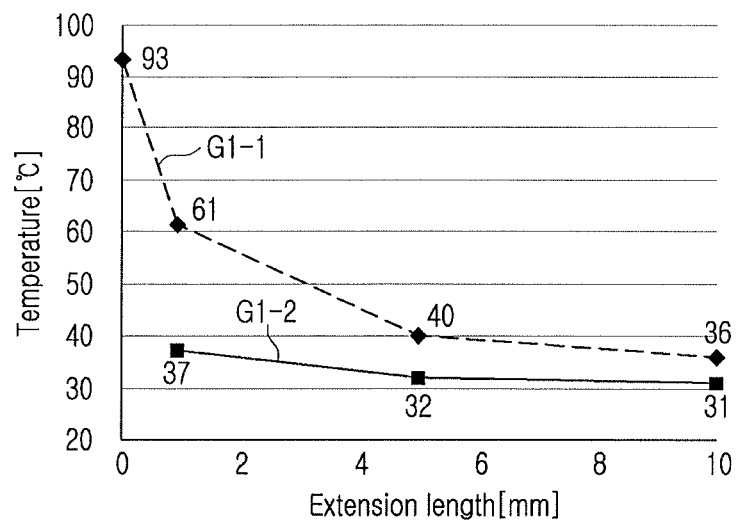
FIG. 25 illustrates a graph of heating characteristics of the LED module in FIG. 21.

FIG. 25 is a graph comparing the correlation among a temperature of a LED module, a length of an exposed region A4 of a circuit board 4001, and a material of the circuit board 4001. G1-1 is the case in which the circuit board 4001 is sapphire, and G1-2 is the case in which the circuit board 4001 is a Cu substrate. Compared to the case of G1-1, in which the circuit board 4001 is sapphire, in the case of G1-2, in which the circuit board 4001 is Cu, heat efficiency is excellent, so it is confirmed that a temperature of a LED module is low. In addition, in the case of G1-2, as a length of the exposed region A4 of the circuit board 4001 is increased, a temperature of the circuit board 4001 is generally lowered. Even when a length of A4 increases twice from 5 mm to 10 mm, it is confirmed that a temperature difference of a LED module is only 4° C. As a length of A4 increases, manufacturing costs are also increased. Thus, it is important to determine A4, capable of significantly reducing an increase in manufacturing costs while maintaining a temperature of a LED module within a proper temperature.

Figure 26:
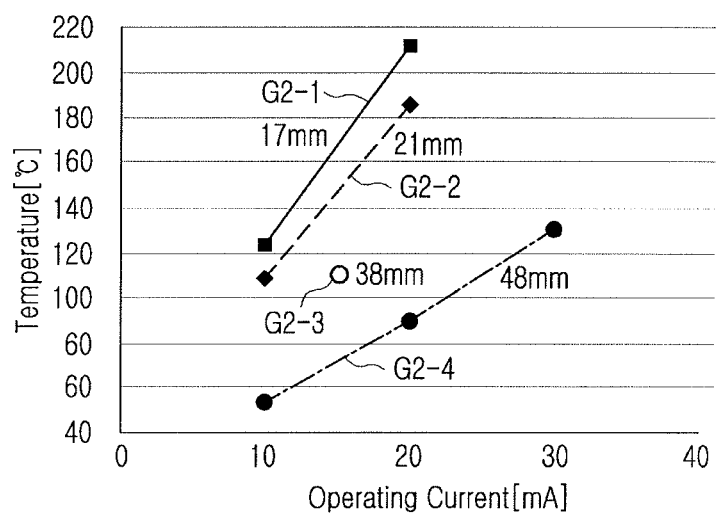
FIG. 26 illustrates a graph of the relationship between input current and length of a LED module.
Figure 27:
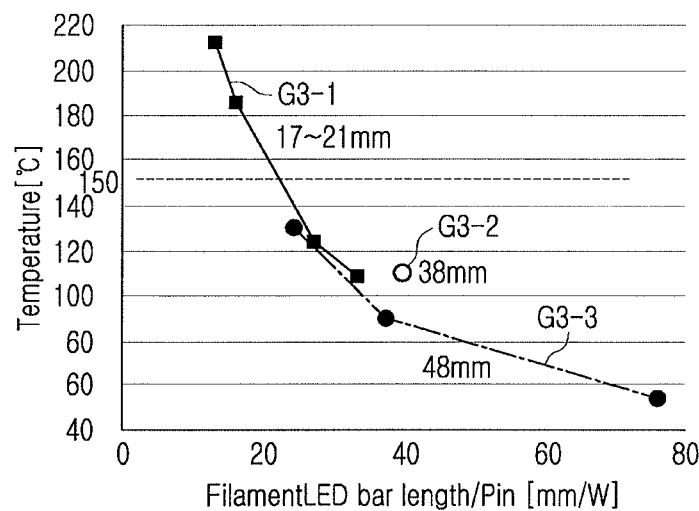
FIG. 27 illustrates a graph of the relationship between power consumption, a length of a LED module, and heating characteristics.
Figure 28:
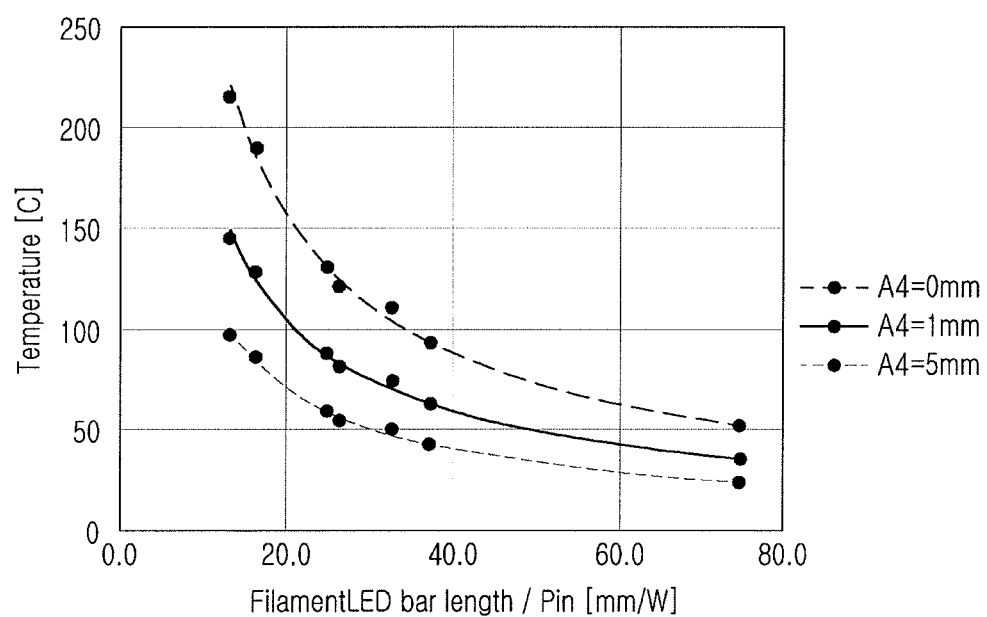
FIG. 28 illustrates a graph of the relationship between portion A4 of FIG. 22, power consumption, and heating characteristics.

FIG. 26 is a drawing illustrating a relationship between an input current and a length of a LED module, FIG. 27 is a drawing illustrating a relationship among power consumption, a length of a LED module, and heating characteristics, and FIG. 28 is a drawing illustrating a relationship among portion A4 of FIG. 22, power consumption, and heating characteristics.

Referring to FIG. 26, as a length of a LED module is generally shorter, it is confirmed that a temperature of the LED module increases. Moreover, as a current applied to a LED module increases, it is confirmed that a temperature of the LED module increases.

Referring to FIG. 27, as a length of a LED module is shorter, a temperature of the LED module increases. However, as the length of the LED module is shorter, it is confirmed that a length of the LED module per power consumption is rather reduced.

Generally, when a temperature of a LED module exceeds about 150° C., proper operations of the LED module may not be performed. Thus, in the case of G3-1, only when a length of the LED module per power consumption is 20 mm/W or more, it is confirmed that the LED module is normally operated. In the cases of G3-2 and G3-3, even when a length of the LED module per power consumption is reduced, it is confirmed that the LED module is properly operated.

Thus, in order to manufacture a LED module in which manufacturing costs are reduced while the amount of light is not reduced, e.g., same amount of light as a LED module according to the related art, a length of the LED module is reduced, so manufacturing costs may be lowered. Moreover, applied current is adjusted to maintain a length of the LED module per power consumption to be 20 mm/W or more, so a temperature of the LED module should be maintained at a proper temperature (about 150° C. or less).

Referring to FIG. 28, as a width of portion A4 of FIG. 22 is increased, a temperature of a LED module is generally low. Moreover, as a length of the LED module per power consumption Pin is reduced, a temperature of the LED module is increased. The relationship therebetween may be represented by Equation 1 below.

$$\text{Temperature} = 1860 \times (\text{Length/Pin})^{-0.826} \times (-0.137 \times \text{Log}_n(A4) + 0.673) \quad \text{Equation 1}$$

Thus, when a width of portion A4 is increased, it is advantageous to allow a LED module to be heated, but there is a disadvantage in that a size of the LED module is increased, so manufacturing costs are increased. It is preferable to significantly reduce an increase in portion A4 while maintaining a temperature of the LED module to a proper temperature (about 150° C. or less).

Referring to FIG. 28, in the case in which there is no portion A4 (A4=0 mm), when a length of the LED module per power consumption is 20 mm/W or more, it is confirmed that a temperature of the LED module is within a proper temperature range. On the other hand, in the case in which a width of portion A4 is 1 mm (A4=1 mm), even when a length of the LED module per power consumption is reduced to about 15 mm/W, it is confirmed that a temperature of the LED module is within a proper temperature range. In the case in which a width of portion A4 is 5 mm (A4=5 mm), even when a length of the LED module per power consumption is reduced to about 15 mm/W, a temperature of the LED module is maintained to 100° C. or less, lower than a proper temperature, so it is confirmed that power consumption may be further increased.

Figure 29:
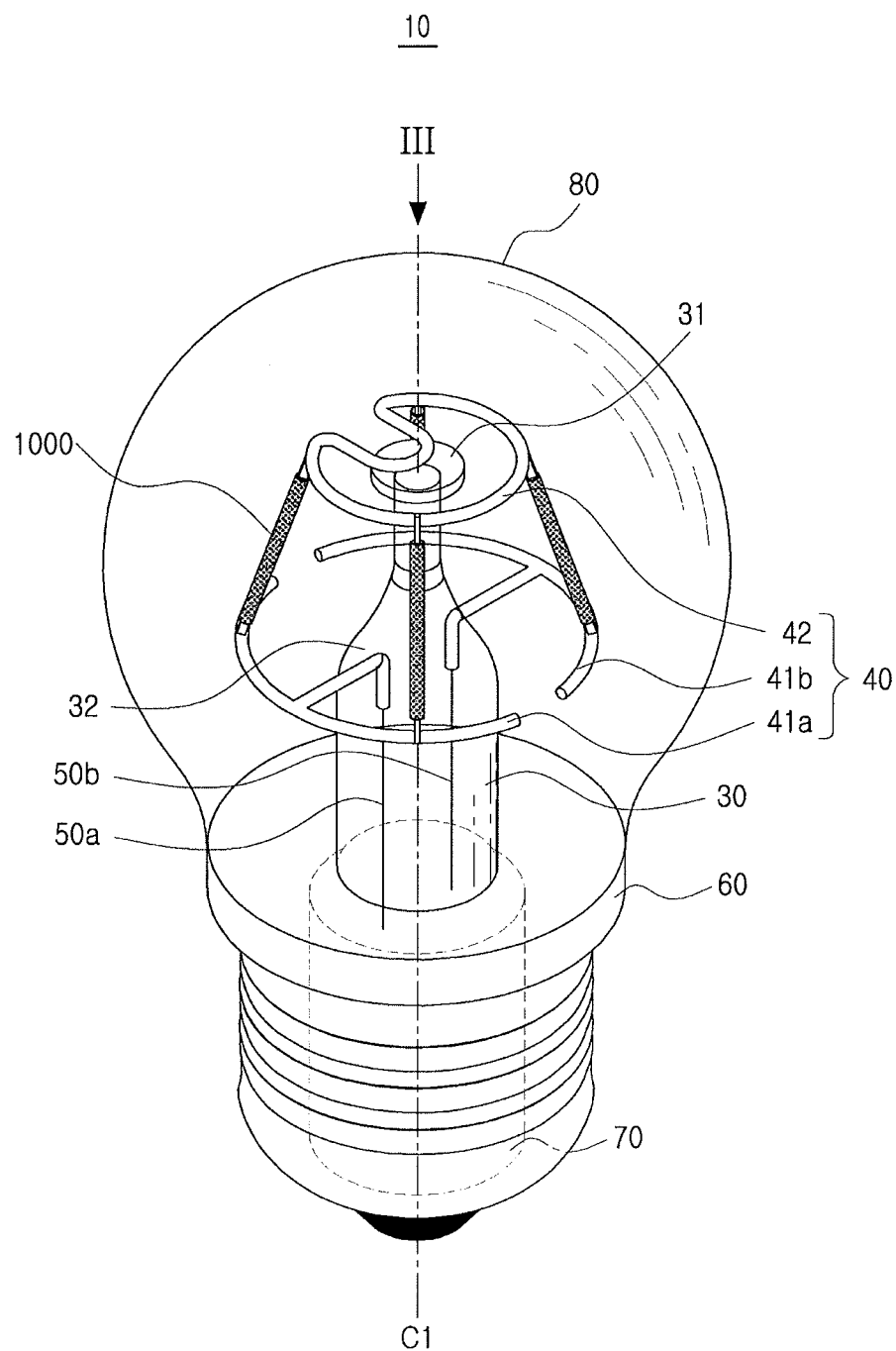
FIG. 29 illustrates a perspective view of a LED lamp according to various example embodiments of the present disclosure.
Figure 30:
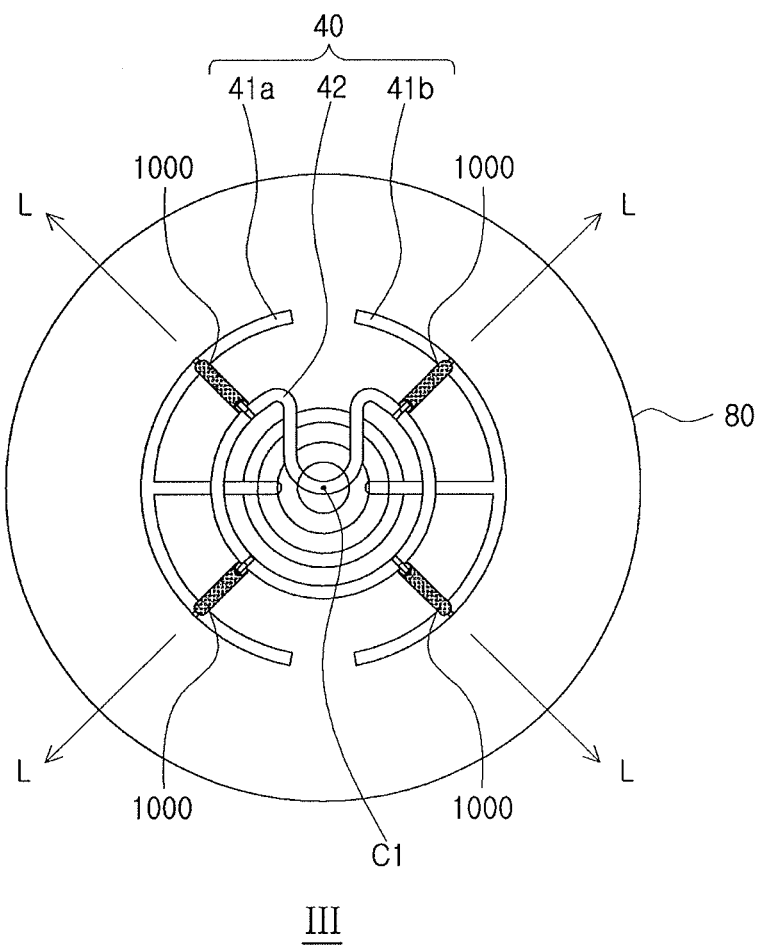
FIG. 30 illustrates a plan view taken in direction III of FIG. 29.

FIG. 29 is a perspective view illustrating a LED lamp according to various example embodiments of the present disclosure, and FIG. 30 is a plan view taken in direction III of FIG. 29.

Referring to FIGS. 29 and 30, a LED lamp 10 according to an example embodiment may include a lamp cover 80, a base 60 combined with one end of the lamp cover 80, and a plurality of LED modules 1000 (for example, four LED modules) mounted on an internal space of the lamp cover 80. The plurality of LED modules 1000 may be soldered and fixed to a frame 40. The LED module 1000 applied to an example embodiment may be the LED module according to the example embodiment described previously (referring to FIGS. 13, 15, 16, and 21).

The lamp cover 80 may be a bulb cover formed of, e.g., glass, hard glass, quartz glass, or a light transmitting resin, and which is transparent, milky, matte, or colored. The lamp cover 80 may be provided as various types, for example, a type having a bulb type cover according to the related art such as an A-type, a G-type, an R-type, a PAR-type, a T-type, an S-type, a candle-type, a P-type, a PS-type, a BR-type, an ER-type, or a BRL-type bulb type cover.

The base 60 is combined with the lamp cover 80, thereby forming an outer cover of the LED lamp 10. In addition, the base is configured to be connected to a socket such as an E40, an E27, an E26, an E14, a GU, a B22, a BX, a BA, an EP, an EX, a GY, a GX, a GR, a GZ, a G-type socket, or the like, in order to be replaced with a lighting device according to the related art. Power supplied to the LED lamp 10 may be applied through the base 60. A power supply unit 70 is disposed in an internal space of the base 60 to AC-DC convert power, applied through the base 60, or to change a voltage, thereby supplying power to the LED module 1000.

One end of a pillar 30 is installed to be fixed to a central portion C1 of the base 60, and the frame 40 for fixing the LED module 1000 may be disposed in the pillar 30. The pillar 30 covers an open region of the lamp cover 80, and welding is performed through a high temperature heat treatment, so a sealed internal space may be formed. Thus, the LED module 1000 disposed in an internal space of the lamp cover 80 may be protected from external moisture, or the like.

The frame 40 may be formed of a metal to fix the LED module 1000 and to supply power, and may include a connecting frame 42 connecting the plurality of LED modules 1000, as well as a first electrode frame 41a and a second electrode frame 41b for supplying power. A mounting unit 31 for fixing the connecting frame 42 may be formed in the other end of the pillar 30. The first electrode frame 41a and the second electrode frame 41b are installed to be fixed to a middle of the pillar 30, thereby supporting the plurality of LED modules 1000 to be welded to the first electrode frame 41a and the second electrode frame 41b. The first electrode frame 41a and the second electrode frame 41b are connected to a first wire 50a and a second wire 50b embedded in the pillar 30, respectively, so power supplied from the power supply unit 70 may be applied.

The LED module 1000 provided as a plurality of LED modules may be accommodated in an internal space of the lamp cover 80.

Referring to FIG. 30, the LED module 1000 may be disposed rotationally symmetrically based on the central portion C1 of the base 60, when taken in direction III of FIG. 29. In detail, the LED module 1000 may be disposed rotationally symmetrically around the pillar 30 toward the lamp cover 80 in an internal space of the lamp cover 80.

As set forth above, according to example embodiments of the present disclosure, manufacturing costs may be reduced in a semiconductor light emitting device and a LED module using the same. That is, a plurality of individually mounted LEDs in a LED bar (in the related art) is replaced with a single multi junction LED including a plurality of LEDs, thereby reducing the time required for mounting each individual LED, which in turn, reduced manufacturing costs. Moreover, in the case of a multi-junction LED, the substrate, e.g., a sapphire substrate having a large diameter of 8 inches or larger, may be used as a support substrate and may have lower costs, e.g., as compared to a growth substrate used for growing a semiconductor layer, thereby further reducing costs.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
a plurality of light emitting cells having a first surface and a second surface opposing each other, the plurality of light emitting cells including a first conductivity-type semiconductor layer, a second conductivity-type semiconductor layer, and an active layer between the first and second conductivity-type semiconductor layers;
an insulating layer on the second surface of the plurality of light emitting cells and having a first opening and a second opening defining a first contact region of the first conductivity-type semiconductor layer and a second contact region of the second conductivity-type semiconductor layer, respectively;
a connection electrode on the insulating layer and connecting a first contact region and a second contact region of adjacent light emitting cells among the plurality of light emitting cells;
a transparent support substrate on the first surface of the plurality of light emitting cells; and
a transparent bonding layer between the plurality of light emitting cells and the transparent support substrate,
wherein the plurality of light emitting cells share a single first conductivity-type semiconductor layer,
wherein the first conductivity-type semiconductor layer has a hexagonal crystal structure, the first surface being a surface of the first conductivity-type semiconductor layer, and
wherein the transparent support substrate has a crystal orientation different from a crystal orientation of the first conductivity-type semiconductor layer.

2. The semiconductor light emitting device as claimed in claim 1, wherein the plurality of light emitting cells have an unevenness portion in the first surface.

3. The semiconductor light emitting device as claimed in claim 1, further comprising a passivation layer on the insulating layer to cover the connection electrode.

4. The semiconductor light emitting device as claimed in claim 1, wherein the transparent bonding layer includes at least one of silicone resin, epoxy resin, polyacrylate, polyimide, polyamide, and benzocyclobutene (BCB).

5. The semiconductor light emitting device as claimed in claim 1, wherein the transparent support substrate is a glass substrate or a sapphire substrate.

6. The semiconductor light emitting device as claimed in claim 1, wherein the transparent support substrate has an unevenness portion on a surface opposite to a surface in contact with the transparent bonding layer.

7. A semiconductor light emitting device, comprising:
a semiconductor stack having a first surface and a second surface opposite each other, the semiconductor stack including a first conductivity-type semiconductor layer, a second conductivity-type semiconductor layer, and an active layer between the first and second conductivity-type semiconductor layers, the first surface and the second surface being defined by the first conductivity-type semiconductor layer and the second conductivity-type semiconductor layer, respectively, and the semiconductor stack being divided into a plurality of light emitting cells by a mesa region;
an insulating layer on the second surface of the semiconductor stack and having a first opening and a second opening defining a first contact region of the first conductivity-type semiconductor layer and a second contact region of the second conductivity-type semiconductor layer, respectively;
a connection electrode on the insulating layer and connecting a first contact region and a second contact region of different light emitting cells to allow the plurality of light emitting cells to be electrically connected to each other;
a transparent bonding layer to cover the first surface of the semiconductor stack; and
a transparent support substrate having a first surface bonded to the first surface of the semiconductor stack by the transparent bonding layer and a second surface opposite to the first surface,
wherein the mesa region extends only partially through the first conductivity-type semiconductor layer, and
wherein a crystal orientation of a first surface of the transparent support substrate that faces the first conductivity-type semiconductor layer is different from a crystal orientation of a first surface of the first conductivity-type semiconductor layer that faces the transparent support substrate.

8. The semiconductor light emitting device as claimed in claim 7, further comprising a reflective layer on the first surface or the second surface of the semiconductor stack.

9. The semiconductor light emitting device as claimed in claim 7, wherein the first contact region of the first conductivity-type semiconductor layer is located toward the second surface of the semiconductor stack.

10. The semiconductor light emitting device as claimed in claim 7, wherein the connection electrode is to allow the plurality of light emitting cells to be connected in series.

11. A light emitting diode (LED) module, comprising:
a circuit board having a bar shape, in which a first connection terminal and a second connection terminal are on a first surface;
at least one LED chip on the first surface of the circuit board, the at least one LED chip being connected to the first connection terminal and the second connection terminal; and
a wavelength conversion portion on at least one of the first surface of the circuit board or a second surface of the circuit board opposite the first surface,
wherein the at least one LED chip includes:
a plurality of light emitting cells having a first surface and a second surface opposing each other, the plurality of light emitting cells including a first conductivity-type semiconductor layer, a second conductivity-type semiconductor layer, and an active layer between the first and second conductivity-type semiconductor layers,
an insulating layer on the second surface of the plurality of light emitting cells and having a first opening and a second opening defining a first contact region of the first conductivity-type semiconductor layer and a second contact region of the second conductivity-type semiconductor layer, respectively,
a connection electrode on the insulating layer and connecting a first contact region and a second contact region of adjacent light emitting cells among the plurality of light emitting cells,
a transparent support substrate on the first surface of the plurality of light emitting cells, the transparent support substrate and the circuit board being on opposite surfaces of the at least one LED chip, and
a transparent bonding layer disposed between the plurality of light emitting cells and the transparent support substrate,
wherein a crystal orientation of a first surface of the transparent support substrate that faces the first conductivity-type semiconductor layer is different from a crystal orientation of a first surface of the first conductivity-type semiconductor layer that faces the transparent support substrate.

12. The LED module as claimed in claim 11, wherein the circuit board and the transparent support substrate include materials having a same composition.

13. The LED module as claimed in claim 11, wherein the plurality of light emitting cells is between the transparent support substrate and the circuit board.

14. The LED module as claimed in claim 11, wherein the circuit board is a transparent substrate.

15. The LED module as claimed in claim 14, wherein the circuit board has an unevenness portion on the second surface.

16. The LED module as claimed in claim 11, wherein the wavelength conversion portion is in a first region of the circuit board including the light emitting diode chip, and the circuit board has a second region in which the wavelength conversion portion is not disposed.

17. The LED module as claimed in claim 16, wherein the region of the circuit board in which the wavelength conversion portion is not disposed is symmetrical in a width direction perpendicular to a length direction of the circuit board.

* * * * *